(12) United States Patent
Makiyama

(10) Patent No.: US 9,184,273 B2
(45) Date of Patent: Nov. 10, 2015

(54) COMPOUND SEMICONDUCTOR DEVICE AND METHOD OF MANUFACTURING THE SAME

(71) Applicant: FUJITSU LIMITED, Kawasaki-shi, Kanagawa (JP)

(72) Inventor: Kozo Makiyama, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/205,740

(22) Filed: Mar. 12, 2014

(65) Prior Publication Data

US 2014/0312362 A1    Oct. 23, 2014

(30) Foreign Application Priority Data

Apr. 18, 2013    (JP) .................................. 2013-087736

(51) Int. Cl.
*H01L 31/0312*    (2006.01)
*H01L 21/338*    (2006.01)
*H01L 29/778*    (2006.01)
(Continued)

(52) U.S. Cl.
CPC ............ *H01L 29/778* (2013.01); *H01L 23/291* (2013.01); *H01L 23/3192* (2013.01); *H01L 29/66431* (2013.01); *H01L 29/66462* (2013.01); *H01L 29/7787* (2013.01); *H01L 29/2003* (2013.01); *H01L 29/402* (2013.01); *H01L 29/432* (2013.01); *H01L 29/518* (2013.01); *H01L 2224/05553* (2013.01); *H01L 2224/05554* (2013.01); *H01L 2224/0603* (2013.01); *H01L 2224/32245* (2013.01); *H01L 2224/48091* (2013.01); *H01L 2224/48247* (2013.01); *H01L 2224/48257* (2013.01);
(Continued)

(58) Field of Classification Search
CPC ..................... H01L 29/7787; H01L 29/66431; H01L 29/205; H01L 29/778
USPC ............................................. 257/77; 438/172
See application file for complete search history.

(56) References Cited

U.S. PATENT DOCUMENTS

2006/0043415 A1    3/2006    Okamoto et al.
2010/0176421 A1    7/2010    Van Hove et al.
(Continued)

FOREIGN PATENT DOCUMENTS

| JP | 2011-192719 A1 | 9/2011 |
| WO | 2012/111363 A1 | 8/2012 |
| WO | WO 2012111363 A1 * | 8/2012 |

OTHER PUBLICATIONS

Extended European Search Report dated Sep. 9, 2014 in the corresponding European patent application No. 14159116.4-1552.
(Continued)

*Primary Examiner* — David S Blum
(74) *Attorney, Agent, or Firm* — Kratz, Quintos & Hanson, LLP

(57) ABSTRACT

An embodiment of a compound semiconductor device includes: a substrate; a compound semiconductor stacked structure of nitride over the substrate; a passivation film that covers the compound semiconductor stacked structure; a gate electrode, a source electrode, and a drain electrode at a level above the compound semiconductor stacked structure; and an Si—C bond containing film that contains an Si—C bond and includes a part between the source electrode and the drain electrode. The part contacts at least a part of an upper surface of the compound semiconductor stacked structure or at least a part of an upper surface of the passivation film.

15 Claims, 27 Drawing Sheets

(51) Int. Cl.
*H01L 23/29* (2006.01)
*H01L 23/31* (2006.01)
*H01L 29/66* (2006.01)
*H01L 29/40* (2006.01)
*H01L 29/43* (2006.01)
*H01L 29/51* (2006.01)
*H01L 29/20* (2006.01)

(52) U.S. Cl.
CPC ............. *H01L 2224/48472* (2013.01); *H01L 2224/73265* (2013.01); *H01L 2924/12032* (2013.01)

(56) References Cited

U.S. PATENT DOCUMENTS

2012/0211800 A1 8/2012 Boutros
2013/0069129 A1 3/2013 Makiyama et al.

OTHER PUBLICATIONS

Office Action of EP Patent Application 14159116.4 dated May 5, 2015.

* cited by examiner

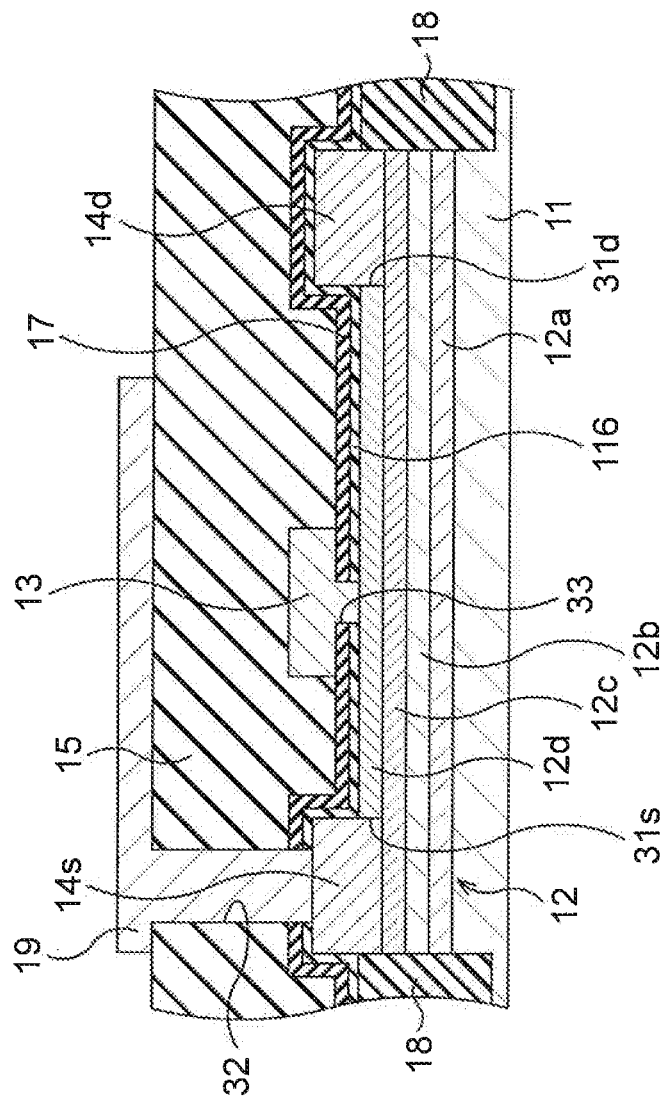

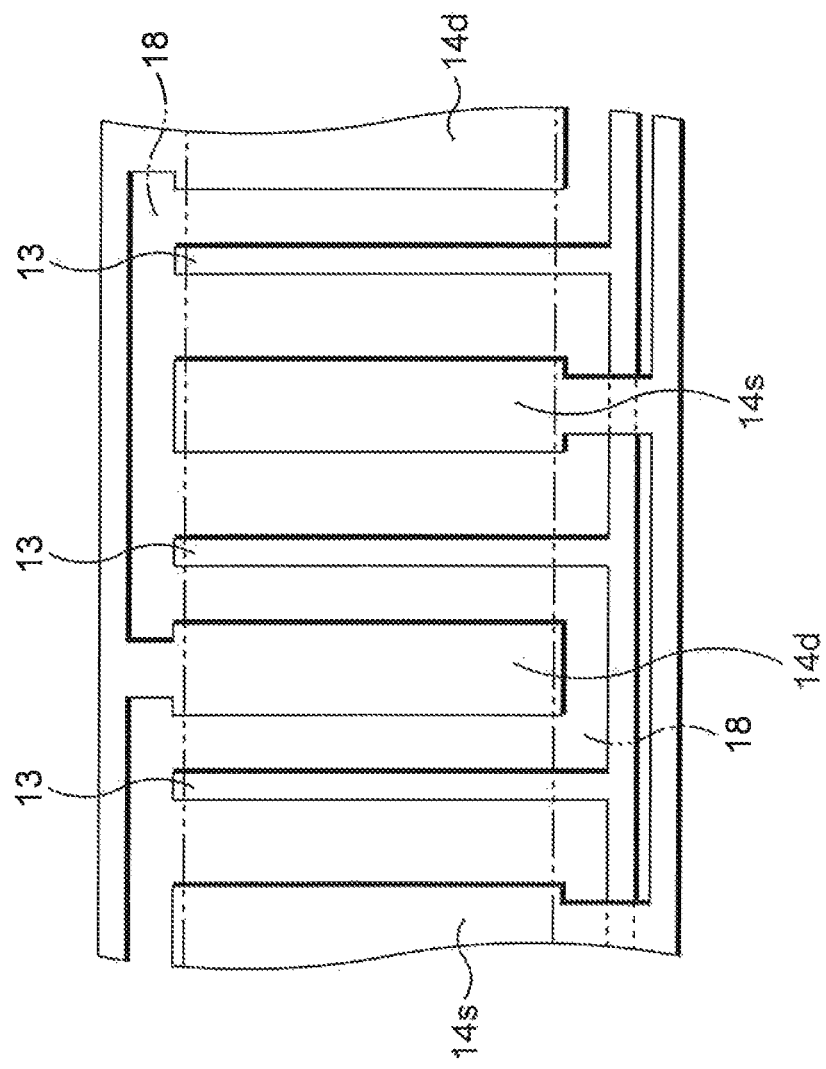

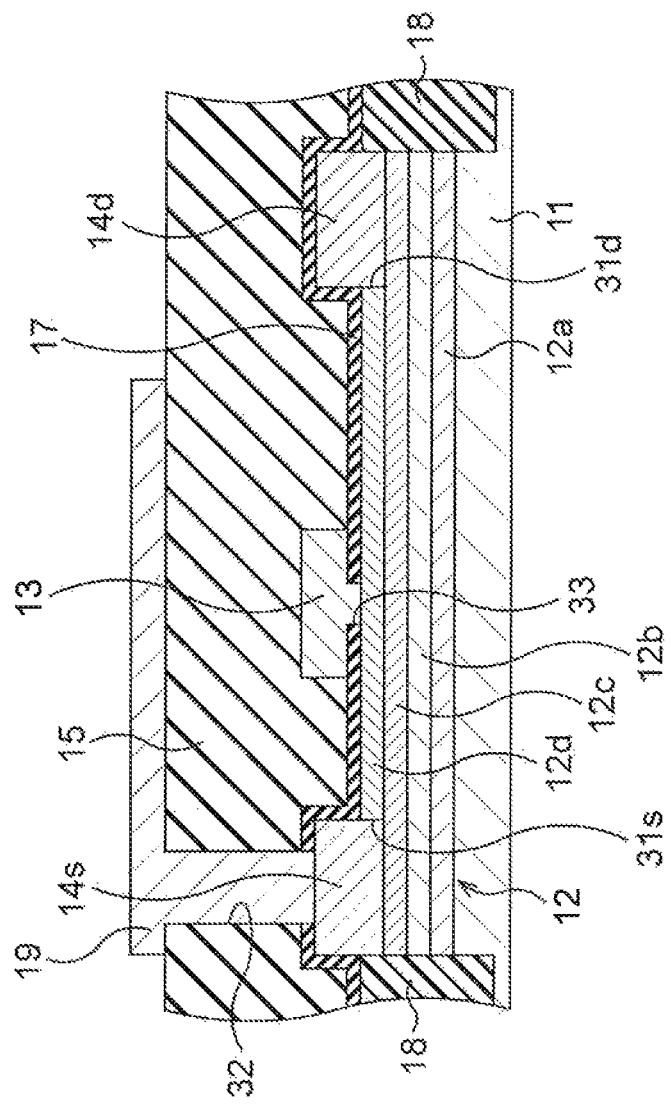

US 9,184,273 B2

COMPOUND SEMICONDUCTOR DEVICE AND METHOD OF MANUFACTURING THE SAME

CROSS-REFERENCE TO RELATED APPLICATION

This application is based upon and claims the benefit of priority of the prior Japanese Patent Application No. 2013-087736, filed on Apr. 18, 2013, the entire contents of which are incorporated herein by reference.

FIELD

The embodiments discussed herein are directed to a compound semiconductor device and a method of manufacturing the same.

BACKGROUND

In a compound semiconductor device, particularly in a high-power high-frequency device which includes a high electron mobility transistor (HEMT) of nitride such as GaN, a high electric field is apt to be applied to a periphery of a gate electrode. If a part of electrons accelerated by the electric field is transited and trapped by traps, the part of electron broadens a depletion layer and lowers a current. It is known that traps exist in an interface between a passivation film such as a silicon nitride film and a compound semiconductor layer, and inside and on a surface of a passivation film. Such a phenomenon is peculiar to a nitride semiconductor device and is called a current collapse. The current collapse lowers output characteristics of an amplifier such as output and efficiency. In a case where a structure of a gate electrode is of an overhang type, a depletion layer is hard to be broadened due to existence of traps during the off-time, and thus a gate leakage current is apt to increase.

[Patent Literature 1] Japanese Laid-open Patent Publication No. 2011-192719.

SUMMARY

According to an aspect of the embodiments, a compound semiconductor device includes: a substrate; a compound semiconductor stacked structure of nitride over the substrate; a passivation film that covers the compound semiconductor stacked structure; a gate electrode, a source electrode, and a drain electrode at a level above the compound semiconductor stacked structure; and an Si—C bond containing film that contains an Si—C bond and includes a part between the source electrode and the drain electrode. The part contacts at least a part of an upper surface of the compound semiconductor stacked structure or at least a part of an upper surface of the passivation film.

According to another aspect of the embodiments, a method of manufacturing a compound semiconductor device includes: forming a compound semiconductor stacked structure of nitride over a substrate; forming a passivation film that covers the compound semiconductor stacked structure; forming a gate electrode, a source electrode, and a drain electrode at a level above the compound semiconductor stacked structure; and forming an Si—C bond containing film that contains an Si—C bond and includes a part between the source electrode and the drain electrode. The part contacts at least a part of an upper surface of the compound semiconductor stacked structure or at least a part of an upper surface of the passivation film.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 1A is a cross-sectional view depicting a structure of a compound semiconductor device according to the first embodiment;

FIG. 1B is a view depicting a layout of the compound semiconductor device according to the first embodiment;

FIG. 3 is a cross-sectional view depicting a structure of a reference example;

DESCRIPTION OF EMBODIMENTS

Figure 2A:
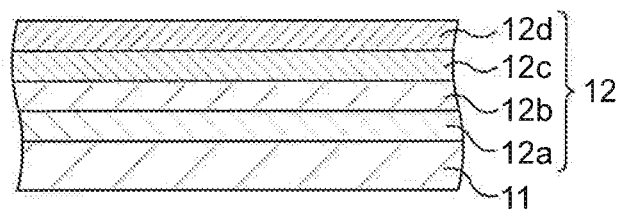
FIG. 2A to FIG. 2L are cross-sectional views depicting a method of manufacturing the GaN-based HEMT according to the first embodiment in a sequence of process steps.

Hereinafter, embodiments will be described concretely with reference to the attached drawings.

First Embodiment

First, a first embodiment will be described. FIG. 1A is a cross-sectional view which depicts a structure of a GaN-based HEMT (compound semiconductor device) according to the first embodiment.

In the first embodiment, as depicted in FIG. 1A, a buffer layer 12a, an electron transit layer 12b, an electron supply layer 12c, and a surface layer 12d are formed on a substrate 11 such as a semi-insulating SiC substrate, for example. The buffer layer 12a, the electron transit layer 12b, the electron supply layer 12c, and the surface layer 12d are included in a compound semiconductor stacked structure 12 of nitride. The buffer layer 12a and the electron transit layer 12b are GaN layers to which intentional impurity doping has not been made (i-GaN layers), for example, and a total thickness thereof is about 3 μm. The buffer layer 12b prevents propagation of a lattice defect which exists in a surface of the substrate 11 to the electron transit layer 12b. The electron supply layer 12c is an n-type AlGaN layer (n-AlGaN layer), for example, and a thickness thereof is about 10 nm. The surface layer 12d is an n-type GaN layer (n-GaN layer), for example, and a thickness thereof is 10 nm or less. A two-dimensional electron gas (2DEG) exists in the vicinity of the electron supply layer 12c in the electron transit layer 12b.

An element isolation region 18 which defines an active region is formed in a periphery of the buffer layer 12a, the electron transit layer 12b, the electron supply layer 12c, and the surface layer 12d. Recesses 31s and 31d which expose the electron supply layer 12c are formed in the surface layer 12d, and a source electrode 14s is formed in the recess 31s and a drain electrode 14d is formed in the recess 31d. An Si—C bond containing film 116 and a passivation film 17 which cover the surface layer 12d, the source electrode 14s, and the drain electrode 14d are formed. The Si—C bond containing film 116 is an SiOC film which contains an Si—C bond, for example, and a thickness thereof is about 10 nm, for example. The passivation film 17 is a silicon nitride film, for example, and a thickness thereof is about 40 nm, for example. An opening 33 is formed in the passivation film 17 and the Si—C bond containing film 116 between the source electrode 14s and the drain electrode 14d. A gate electrode 13 which contacts the surface layer 12d through the opening 33 is formed on the passivation film 17. An insulating film 15 which covers the gate electrode 13 is formed on the passivation film 17. An opening 32 which exposes a part of the source electrode 14s is formed in the insulating film 15, the passivation film 17, and the Si—C bond containing film 116, and a filed plate 19 connected to the source electrode 14s through the opening 32 is formed on the insulating film 15. The field plate 19 passes above the gate electrode 13, and extends to between the gate electrode 13 and the drain electrode 14d in planar view. The field plate 19 is sometimes called a source wall. For example, the source electrode 14s and the field plate 19 are grounded.

In the GaN-based HEMT configured as above, since the Si—C bond containing film 116 is formed between the passivation film 17 and the surface layer 12d, traps due to dangling bonds in the vicinity of an upper surface of the surface layer 12d in particular are substantially decreased. Thus, a current collapse and a leakage current are suppressed.

While FIG. 1A depicts a discrete type embodiment, a layout viewed from a front surface side of the substrate 11 is depicted as in FIG. 1B in a case where a multi-finger gate structure is adopted, for example. In other words, each of the planar shapes of the gate electrode 13, the source electrode 14s, and the drain electrode 14d exhibits a comb teeth shape, and the source electrode 14s and the drain electrode 14d are alternately disposed. Further, the gate electrodes 13 are commonly connected to one another, the source electrodes 14s are commonly connected to one another, and the drain electrodes 14d are commonly connected to one another. Adoption of the multi-finger gate structure can improve an output.

Next, a method of manufacturing the GaN-based HEMT according to the first embodiment will be described. FIG. 2A to FIG. 2L are cross-sectional views which depict the method of manufacturing the GaN-based HEMT according to the first embodiment in a sequence of process steps.

First, as depicted in FIG. 2A, the buffer layer 12a, the electron transit layer 12b, the electron supply layer 12c, and the surface layer 12d are epitaxially grown by a metal organic chemical vapor deposition (MOCVD) method, for example, on the substrata 11 such as a semi-insulating SiC substrate, for example. The buffer layer 12a, the electron transit layer 12b, the electron supply layer 12c, and the surface layer 12d are included in the compound semiconductor stacked structure 12.

Figure 2B:
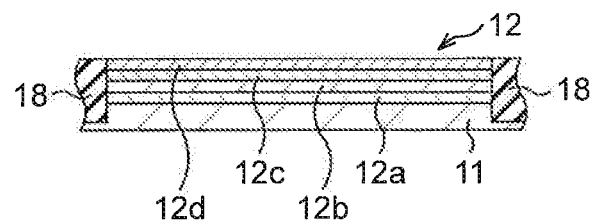

Then, as depicted in FIG. 2B, the element isolation region 18 which defines the active region is formed in the compound semiconductor stacked structure 12 and a surface layer portion, of the substrate 11 by selectively injecting Ar into the compound semiconductor stacked structure 12.

Figure 2C:
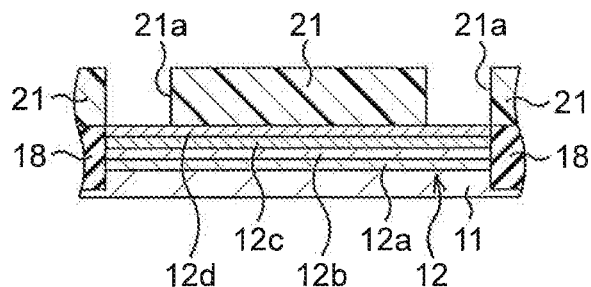

Thereafter, as depicted in FIG. 2C, a resist pattern 21 is formed which includes openings 21a in a region in which a source electrode is to be formed and in a region in which a drain electrode is to be formed on the compound semiconductor stacked structure 12.

Figure 2D:
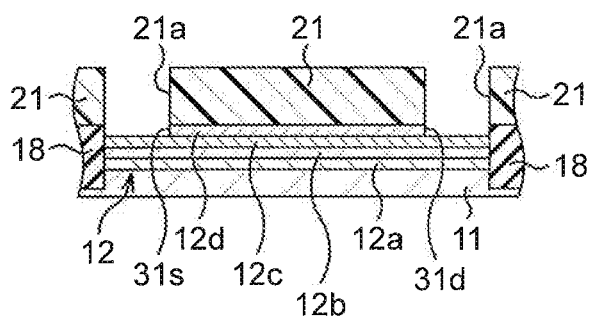

Subsequently, as depicted in FIG. 2D, the surface layer 12d is dry-etched with an inert gas and a chlorine gas such as a $Cl_2$ gas with the resist pattern 21 being used as a mask so as to form the recesses 31s and 31d in the surface layer 12d. With regard to depths of the recesses 31s and 31d, a part of the surface layer 12d may be left and a part of the electron supply layer 12c may be removed. In other words, the depths of the recesses 31s and 31d are not required to be the same as a thickness of the surface layer 12d.

Figure 2E:
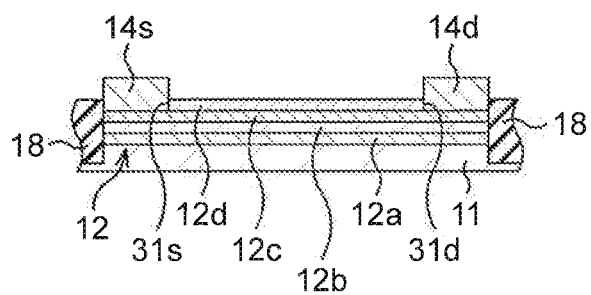

Then, as depicted in FIG. 2E, the source electrode 14s is formed in the recess 31s, and the drain electrode 14d is formed in the recess 31d. In forming the source electrode 14s and the drain electrode 14d, for example, a Ti layer is formed by a vapor deposition method and an Al layer is formed thereon by a vapor deposition method. A thickness of the Ti layer is about 20 nm, and a thickness of the Al layer is about 200 nm. Then, the resist pattern 21 having been used in formation of the recesses 31s and 31d are removed together with the Ti layer and the Al layer thereon. In other words, in the formation of the source electrode 14s and the drain electrode 14d, techniques of vapor deposition and lift-off are used, for example. Thereafter, by performing a heat treatment at about 550° C., the source electrode 14s and the drain electrode 14d, and a surface of the compound semiconductor stacked structure 12 (surface of the electron supply layer 12c)

are ohmic-contacted. A resist pattern used for lift-off may be different from the resist pattern 21 having been used in the formation of the recesses 31s and 31d. For example, an eaves structure resist may be used.

Figure 2F:
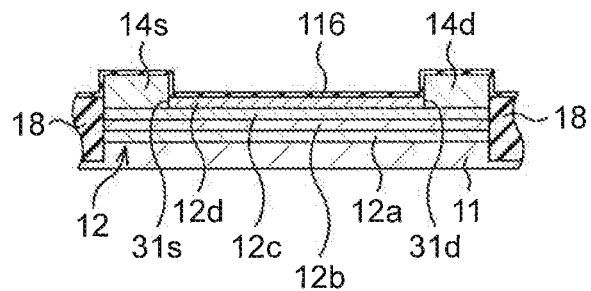

Subsequently, as depicted in FIG. 2F, the Si—C bond containing film 116 is formed which covers the surface layer 12d, the source electrodes 14s, the drain electrode 14d, and the element isolation region 18. In formation of the Si—C bond containing film 116, application and curing of a chemical synthesis spin-on-glass (SOG) agent is performed, for example. The chemical synthesis SOG agent may contain silane coupling agent, silanol, siloxane, or the like. In applying the chemical synthesis SOG agent, spin coating of PTS (produced by Honeywell Electronic Materials) diluted with propylene glycol monomethyl ether acetate (PGMEA) is performed, for example. A temperature of curing is about 350° C., for example.

Figure 2G:
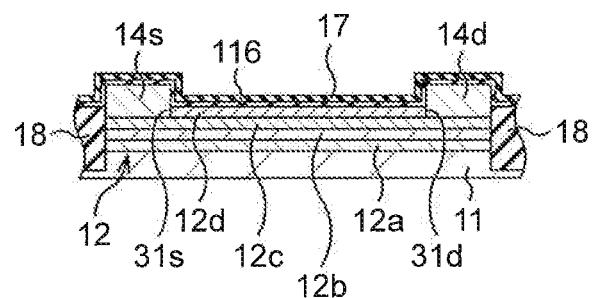

Then, as depicted in FIG. 2G, the passivation film 17 is formed on the Si—C bond containing film 116. As the passivation film 17, a silicon nitride (SiN) film is formed by a plasma CVD method, for example.

Figure 2H:
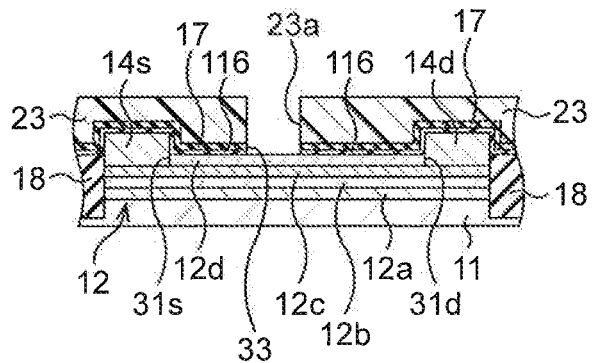

Thereafter, as depicted in FIG. 2H, a resist pattern 23 is formed which has an opening 23a in a region in which an opening for a gate electrode is to be formed on the passivation film 17. As a material of the resist patter 23, PFI-32 produced by Sumitomo Chemical Co., Ltd., for example, may be used. With regard to exposure in forming the opening 23a, ultraviolet exposure is performed, and as a developing solution, NMD-W produced by TOKYO OHKA KOGYO CO., LTD, for example, may be used. An opening 33 is formed in the passivation film 17 and the Si—C bond containing film 116 by dry etching which uses the resist pattern 23 as a mask. In this dry etching, an $SF_6$ gas is used, for example. A width of the opening 33 is about 600 nm, for example. After formation of the opening 33, the resist pattern 23 is removed.

Figure 2I:
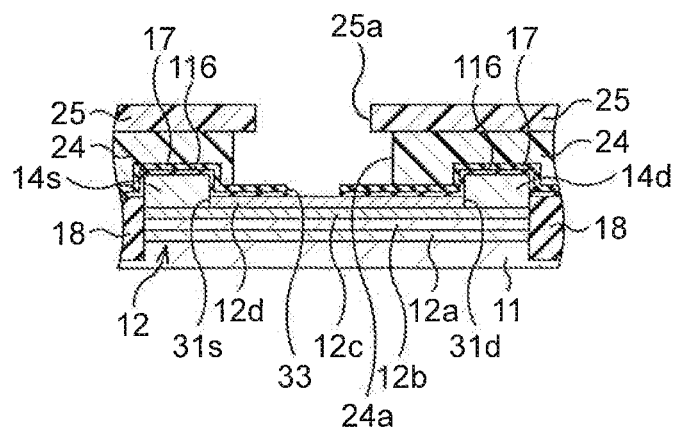

Subsequently, as depicted in FIG. 2I, a resist pattern 24 which has an opening 24a for the gate electrode and a resist pattern 25 which has an opening 25a narrower than the opening 24a are formed on the passivation film 17. As a material of the resist pattern 24, for example, polymethylglutarimide (PMGI), (produced by MicroChem Corp., USA, for example) may be used, and as a material of the resist pattern 25, PFI-32 produced by Sumitomo Chemical Co., Ltd., for example, may used. With regard to exposure in forming the openings 24a and 25a, ultraviolet exposure is performed, and as a developing solution, NMD-W produced by TOKYO OHKA KOGYO CO., LTD, for example, may be used. A width of the opening 25a is about 1.5 μm, for example. By the above treatments, a multilayer resist of an eaves structure is obtained.

Figure 2J:
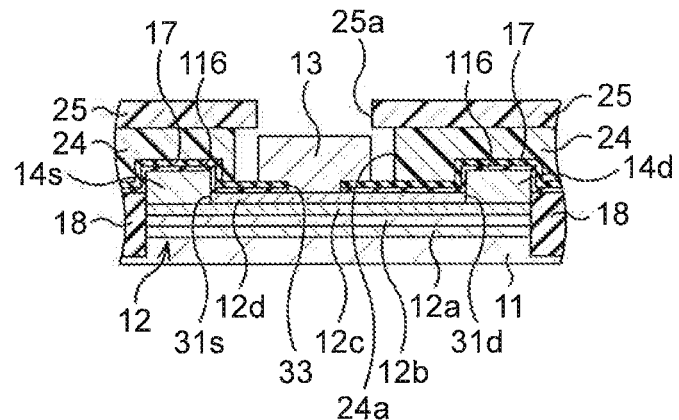

Then, as depicted in FIG. 2J, the gate electrode 13 which contacts the surface layer 12d through the opening 33 is formed on the passivation film 17. In forming the gate electrode 13, an Ni layer is formed by a vapor deposition method, and an Au layer is formed thereon by a vapor deposition method, for example. A thickness of the Ni layer is about 10 nm, while a thickness of the Au layer is about 300 nm.

Figure 2K:
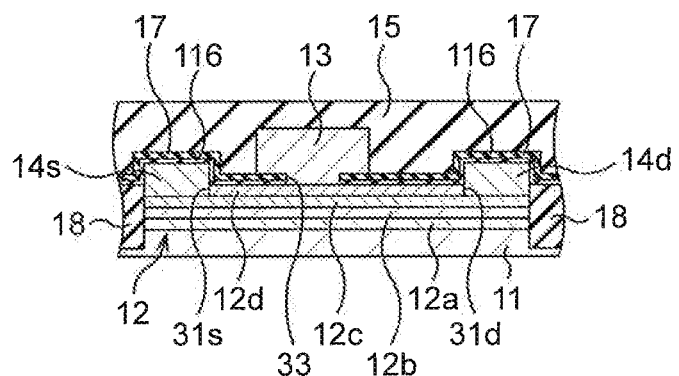

Thereafter, as depicted in FIG. 2K, the resist patterns 24 and 25 are removed together with the Ni layer and the Au layer thereon with a warmed organic solvent. In other words, in formation of the gate electrode 13 also, techniques of vapor deposition and lift-off, for example, are used. Subsequently, the insulating film 15 which covers the gate electrode 13 is formed on the passivation film 17. As the insulating film 15, a silicon nitride (SiN) film is formed by a plasma CVD method, for example.

Figure 2L:
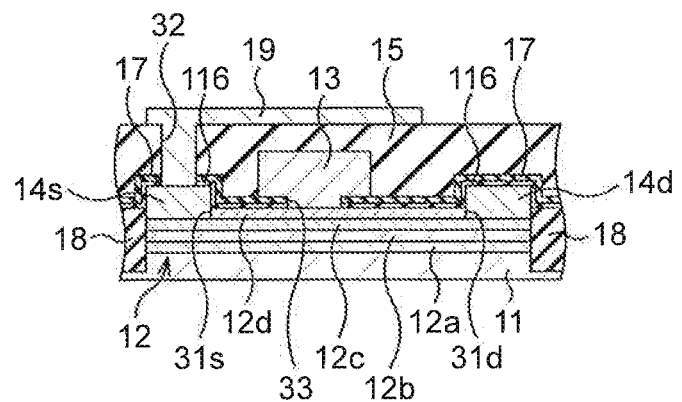

Then, as depicted in FIG. 2L, the opening 32 which exposes a part of the source electrode 14s is formed in the insulating film 15, the passivation film 17, and the Si—C bond containing film 116. Thereafter, a field plate 19 connected to the source electrode 14s through the opening 32 is formed on the insulating film 15 by an Au plating method, for example.

Then, a protective film, a wiring, and so on are formed as necessary, and the GaN-based HEMT (semiconductor device) is completed.

In the GaN-based HEMT manufactured by the method, since the Si—C bond containing film 116 is formed with a chemical synthesis SOG agent, there exists a bond in which O (oxygen) is between Ga (gallium) contained in the surface layer 12d and Si (silicon) contained in the Si—C bond containing film 116, or gallium atoms in the surface layer 12d are bonded with silicon atoms in the Si—C bond containing film 116 via oxygen atoms. In other words, a bond represented by "Ga—O—Si" exists. This is a result of an action of the silane coupling agent. Existence of the bond may be confirmed by X-ray photoelectron spectroscopy (XPS), for example. Due to generation of the bond, a dangling bond in the vicinity of an upper surface of the surface layer 12d disappears effectively. Therefore, a current collapse and a leakage current are suppressed effectively. A methyl group may be sometimes contained in the Si—C bond containing film 116, and a hydroxyl group may be sometimes contained in the Si—C bond containing film 116. A dangling bond is not substantially included in the Si—C bond containing film 116 itself, which is formed with a chemical synthesis SOG agent.

Figure 4A:
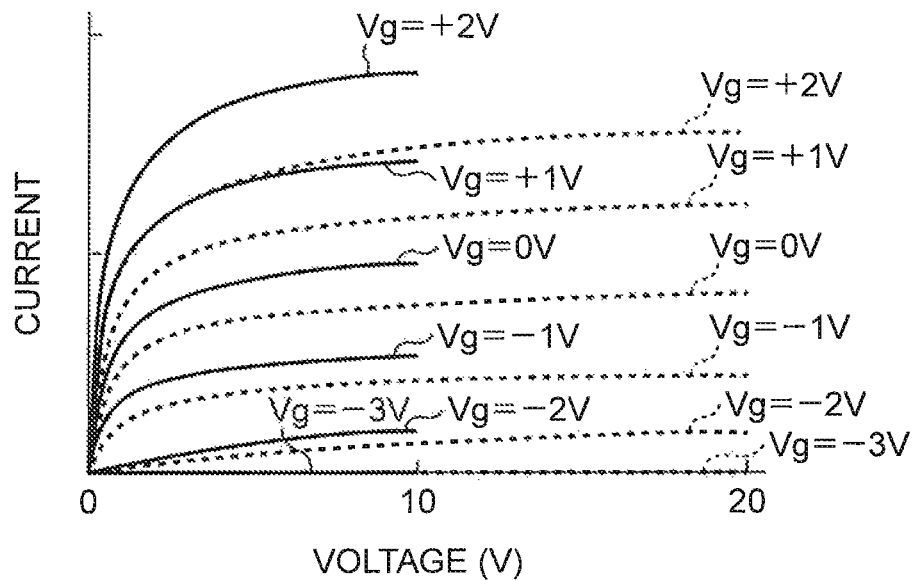
FIGS. 4A and 4B are views depicting pulse I-V characteristics.
Figure 4B:
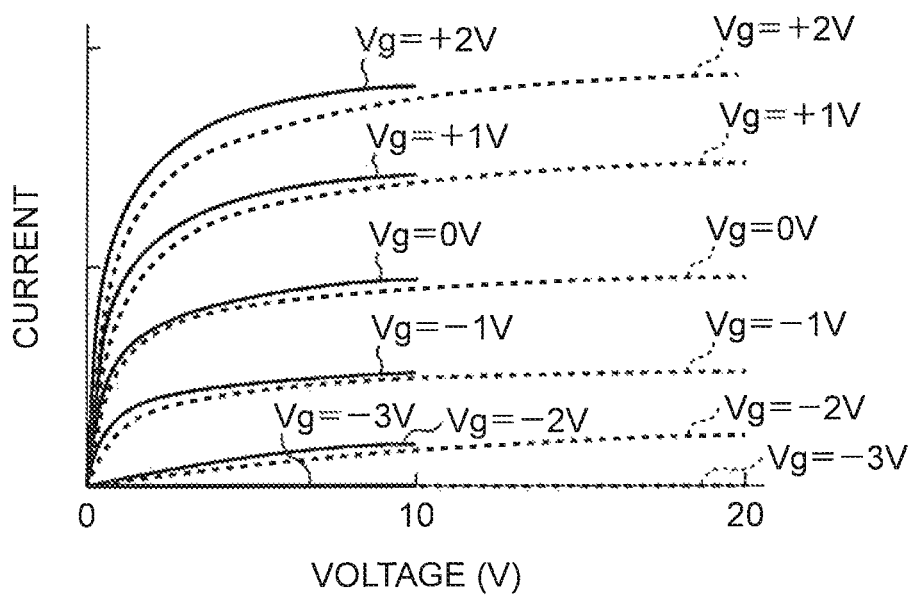
Figure 5:
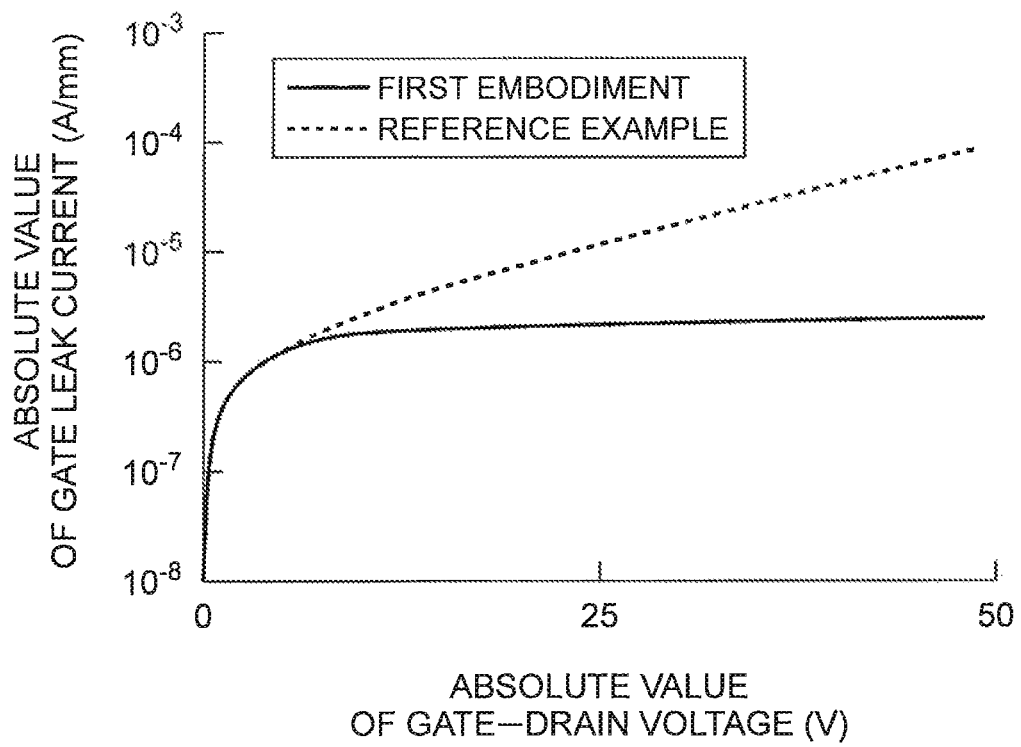
FIG. 5 is a view depicting inverse I-V characteristics between gate and drain.

When characteristics of the first embodiment are compared with characteristics of a reference example which does not include an Si—C bond containing film 116 depicted in FIG. 3, there are differences depicted in FIG. 4A, FIG. 4B, and FIG. 5. FIG. 4A depicts a pulse I-V characteristic of the reference example, and FIG. 4B depicts a pulse I-V characteristic of the first embodiment. Horizontal axes in FIG. 4A and FIG. 4B indicate drain voltages, while vertical axes indicate source-drain currents. Solid lines in FIG. 4A and FIG. 4B indicate characteristics at drain voltages of 10V, while broken lines indicate characteristics at drain voltages of 20V. When FIG. 4A and FIG. 4B are compared with each other, it is obvious that a currant collapse is suppressed in the first embodiment. FIG. 5 depicts inverse I-V characteristics between gate and drain of the reference example and the first embodiment. It is obvious that a leakage current is suppressed in the first embodiment.

Second Embodiment

Figure 6:
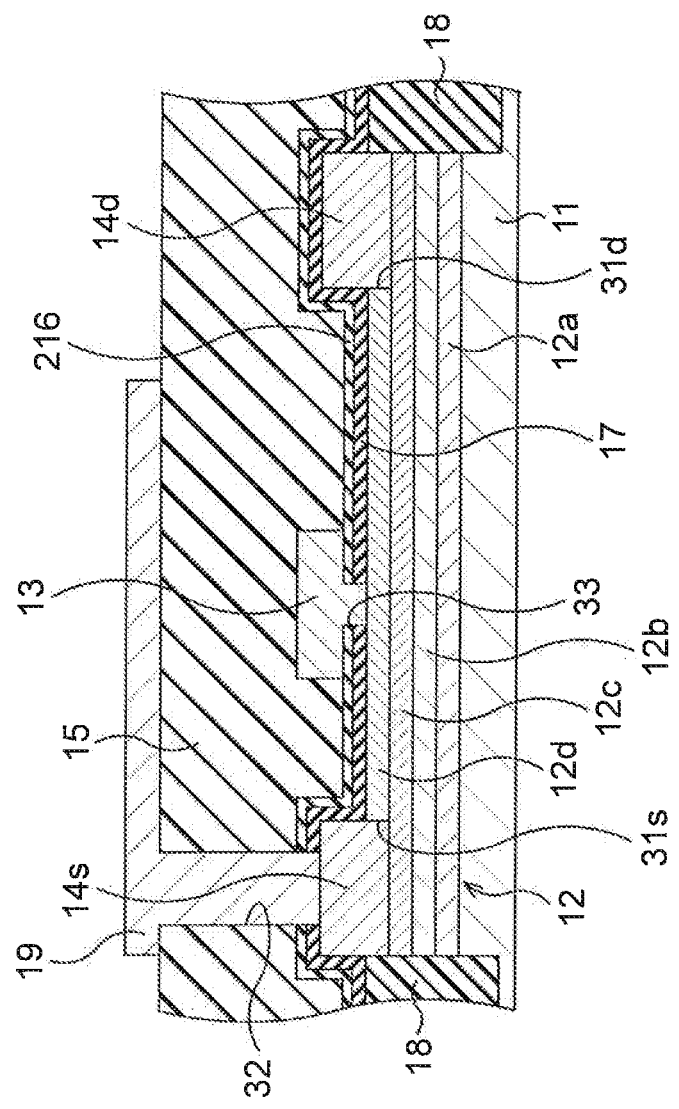
FIG. 6 is a cross-sectional view depicting a structure of a compound semiconductor device according to the second embodiment.

Next, a second embodiment, will be described. FIG. 6 is a cross-sectional view which depicts a structure of a GaN-based HEMT (compound semiconductor device) according to the second embodiment.

In the second embodiment, as depicted in FIG. 6, the Si—C bond containing film 116 is not formed and an Si—C bond containing film 216 is formed on an upper surface of the passivation film 17. Other configuration is similar to that of the first embodiment.

In the GaN-based HEMT configured as above, since the Si—C bond containing film 216 is formed on the upper surface of the passivation film 17, traps due to dangling bonds in the vicinity of the upper surface of the passivation film 17 in particular are substantially decreased. Thus, a current collapse and a leakage current are suppressed.

Next, a method of manufacturing the GaN-based HEMT according to the second embodiment will be described. FIG. 7A to FIG. 7G are cross-sectional views which depict the method of manufacturing the GaN-based HEMT according to the second embodiment in a sequence of process steps.

Figure 7A:
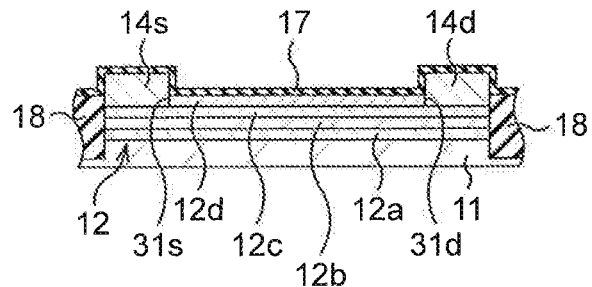
FIG. 7A to FIG. 7G are cross-sectional views depicting a method of manufacturing the GaN-based HEMT according to the second embodiment in a sequence of process steps.

First, the treatments to formation of the source electrode 14s and the drain electrode 14d are performed similarly to in the first embodiment (FIG. 2E). Then, as depicted in FIG. 7A, the passivation film 17 which covers the surface layer 12d, the source electrode 14s, the drain electrode 14d, and the element isolation region 18 is formed.

Figure 7B:
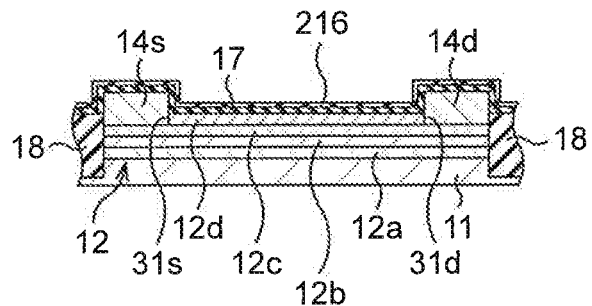

Thereafter, as depicted in FIG. 7B, the Si—C bond containing film 216 is formed on the passivation film 17. In formation of the Si—C bond containing film 216, application and curing of a chemical synthesis SOG agent is performed similarly to in the formation of the Si—C bond containing film 116 in the first embodiment, for example.

Figure 7C:
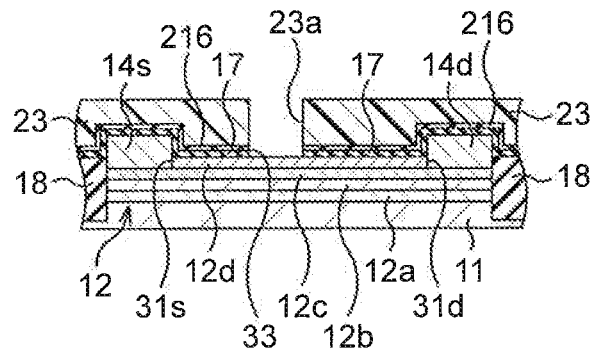

Subsequently, as depicted in FIG. 7C, a resist pattern 23 is formed which has an opening 23a in a region in which an opening for a gate electrode is to be formed on the Si—C bond containing film 216. Then, an opening 33 is formed in the Si—C bond containing film 216 and the passivation film 17 by dry etching which uses the resist pattern 21 as a mask. After formation of the opening 33, the resist pattern 23 is removed.

Figure 7D:
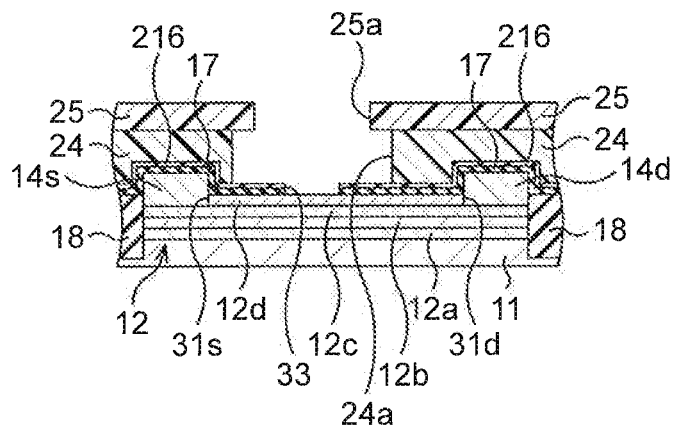

Then, as depicted in FIG. 7D, the resist pattern 24 which has the opening 24a for the gate electrode and the resist pattern 25 which has the opening 25a narrower than the opening 24a are formed on the Si—C bond containing film 216.

Figure 7E:
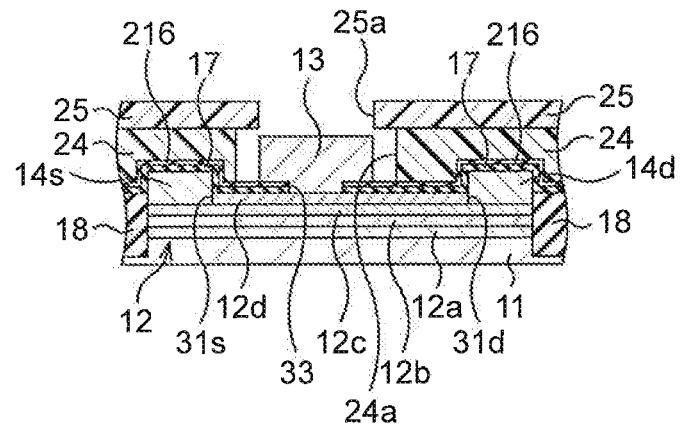

Thereafter, as depicted in FIG. 7E, the gate electrode 13 which contacts the surface layer 12d through the opening 33 is formed on the Si—C bond containing film 216.

Figure 7F:
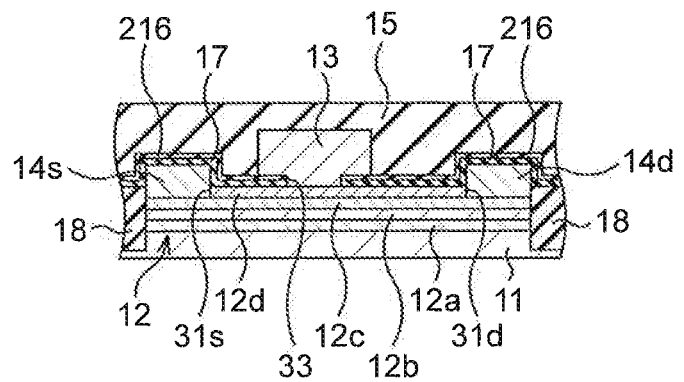

Subsequently, as depicted in FIG. 7F, the resist patterns 24 and 25 are removed together with an Ni layer and an Au layer thereon with a warmed organic solvent. Then, the insulating film 15 which covers the gate electrode 13 is formed on the Si—C bond containing layer 216.

Figure 7G:
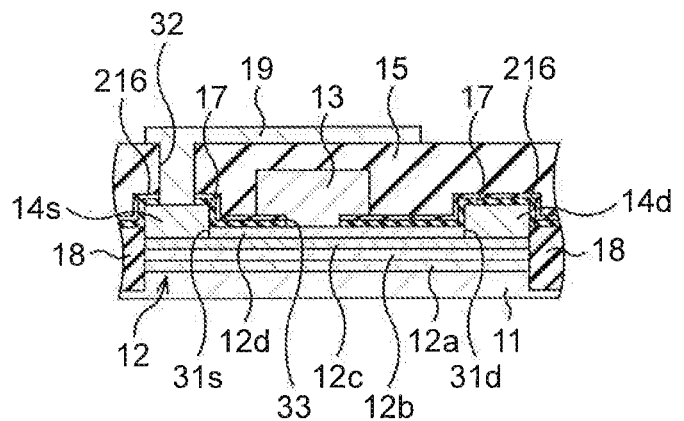

Thereafter, as depicted in FIG. 7G, the opening 32 which exposes a part of the source electrode 14s is formed in the insulating film 15, the Si—C bond containing film 216, and the passivation film 17. Subsequently, the field plate 19 connected to the source electrode 14s through the opening 32 is formed on the insulating film 15.

Then, a protective film, a wiring, and so on are formed as necessary, and the GaN-based HEMT (semiconductor device) is completed.

In the GaN-based HEMT manufactured by the method, since the Si—C bond containing film 216 is formed with a chemical synthesis SOG agent, there exists a bond in which O (oxygen) is between Si (silicon) contained in the passivation film 17 and Si (silicon) contained in the Si—C bond containing film 216, or silicon atoms in the passivation film 17 are bonded with silicon atoms in the Si—C bond containing film 216 via oxygen atoms. In other words, a bond represented by "Si—O—Si" exists. Existence of the bond may be confirmed by XPS, for example. Due to generation of the bond, a dangling bond in the vicinity of an upper surface of the passivation film 17 disappears effectively. Therefore, a current collapse and a leakage current are suppressed effectively. A methyl group may be sometimes contained in the Si—C bond containing film 216, and a hydroxyl group may be sometimes contained in the Si—C bond containing film 216.

Third Embodiment

Figure 8:
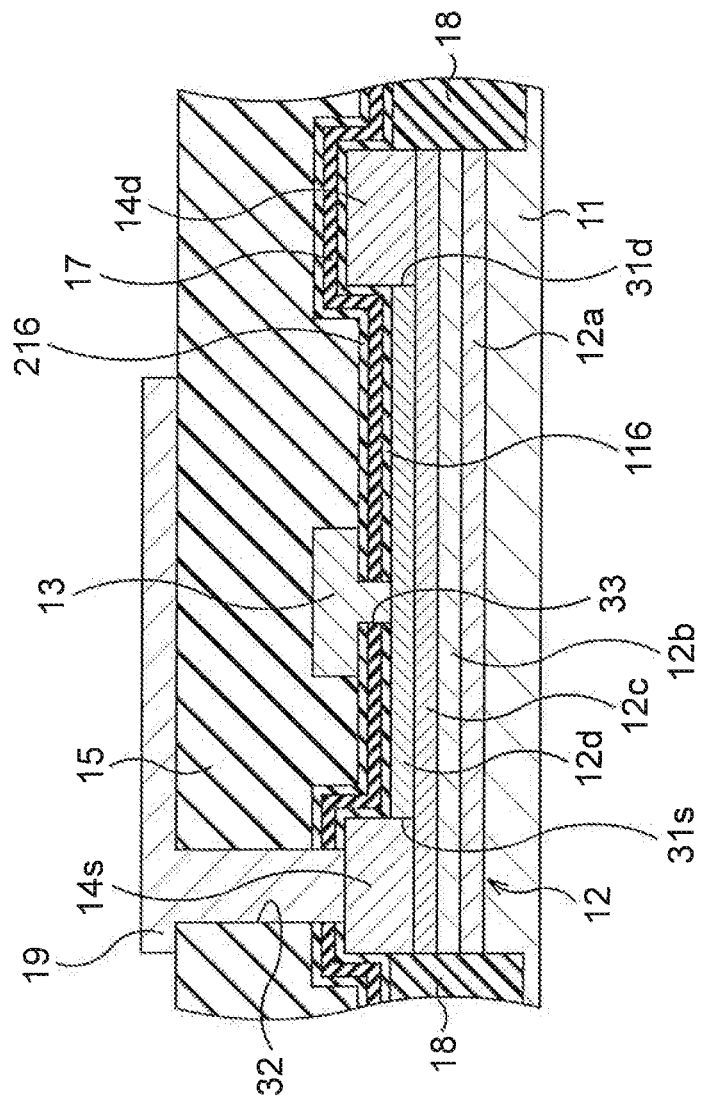
FIG. 8 is a cross-sectional view depicting a structure of a compound semiconductor device according to a third embodiment.

Next, a third embodiment will be described. FIG. 8 is a cross-sectional view which depicts a structure of a GaN-based HEMT (compound semiconductor device) according to the third embodiment.

In the third embodiment, as depicted in FIG. 8, the Si—C bond containing film 216 is formed on an upper surface of the passivation film 17. Other configuration is similar to that of the first embodiment. In other words, the first embodiment and the second embodiment are combined in the third embodiment.

In the GaN-based HEMT configured as above, a current collapse and a leakage current are further suppressed compared with the first embodiment and the second embodiment.

In order to manufacture the compound semiconductor device according to the third embodiment, the method of manufacturing the first embodiment and the method of manufacturing the second embodiment may be combined.

Fourth Embodiment

Figure 9:
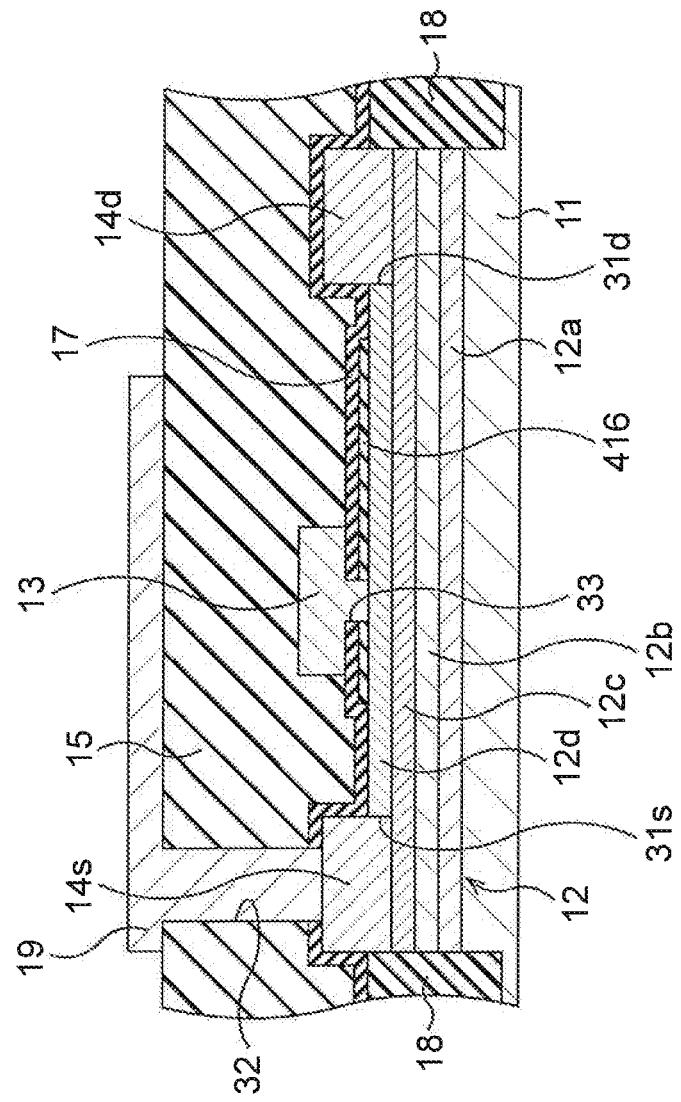
FIG. 9 is a cross-sectional view depicting a structure of a compound semiconductor device according to a third embodiment.

Next, a fourth embodiment will be described. FIG. 9 is a cross-sectional view which depicts a structure of a GaN-based HEMT (compound semiconductor device) according to the fourth embodiment.

In the fourth embodiment, as depicted in FIG. 9, the Si—C bond containing film 116 is not formed and an Si—C bond containing film 416 is formed on a part of an upper surface of the surface layer 12d. The Si—C bond containing film 416, on the drain electrode 14d side of the opening 33, exists from the opening 33 to a position between an end portion on the drain electrode 14d side of the field plate 19 and the drain electrode 14d in planar view. The Si—C bond containing film 416, on the source electrode 14s side of the opening 33, exists from the opening 33 to a position between an end portion on the source electrode 14s side of the gate electrode 13 and the source electrode 14s in planar view. Other configuration is similar to that of the first embodiment.

In the GaN-based HEMT configured as above, since the Si—C bond containing film 416 is formed in a part between the passivation film 17 and the surface layer 12d, traps due to dangling bonds in the vicinity of the upper surface of the surface layer 12d in particular are substantially decreased. Compared with the first embodiment, a current collapse is suppressed sufficiently, though an effect to decrease the traps is slightly lower. This is because regions to which a particularly high electric field is applied are below an end portion on the drain electrode 14d side of the gate electrode 13 and below the end portion on the drain electrode 14d side of the field plate 19, in which regions the Si—C bond containing film 416 is provided.

In the first embodiment, since the Si—C bond containing film 116 contacts the gate electrode 13 and the drain electrode 14d, there is a possibility that a breakdown voltage of the Si—C bond containing film 116 is insufficient depending on a voltage applied to between the gate electrode 13 and the drain electrode 14d. This is because the breakdown voltage of the Si—C bond containing film 116 is lower compared with that of the passivation film 17. In contrast, in the fourth embodiment, the Si—C bond containing film 416 is separated from the drain electrode 14d. In other words, the Si—C bond containing film 416 is electrically insulated from the drain electrode 14d. Thus, it is possible to secure a higher breakdown voltage compared with the first embodiment. In a case where the Si—C bond containing film 416 is electrically insulated from the gate electrode 13 or from both of the drain electrode 14d and the gate electrode 13 also, a high breakdown voltage can be secured.

Next, a method of manufacturing the GaN-based HEMT according to the fourth embodiment will be described. FIG. 10A to FIG. 10I are cross-sectional views which depict the method of manufacturing the GaN-based HEMT according to the fourth embodiment in a sequence of process steps.

Figure 10A:
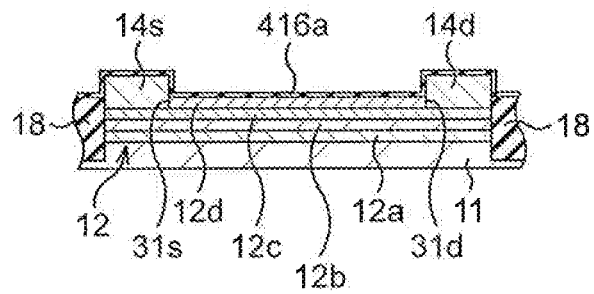
FIG. 10A to FIG. 10I are cross-sectional views depicting a method of manufacturing the GaN-based HEMT according to a fourth embodiment in a sequence HEMT according to a fourth embodiment in a sequence of process steps.

First, the treatments to formation of the source electrode 14s and the drain electrode 14d are performed similarly to in the first embodiment (FIG. 2E). Then, as depicted in FIG. 10A, a Si—C bond containing film 416a is formed which covers the surface layer 12d, the source electrode 14s, the drain electrode 14d, and the element isolation region 18. In formation of the Si—C bond containing film 416a, application and curing of a chemical synthesis SOG agent is performed similarly to in the formation of the Si—C bond containing film 116 in the first embodiment, for example.

Figure 10B:
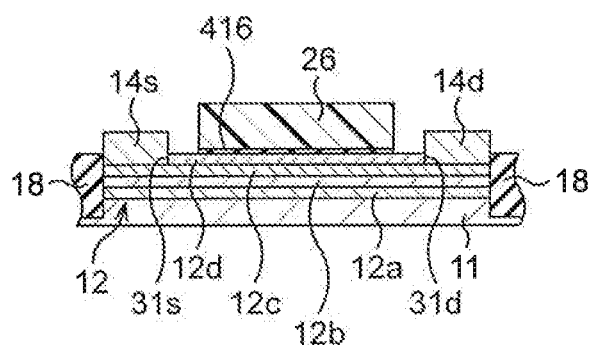

Thereafter, as depicted in FIG. 10B, a resist pattern 26 is formed which covers a region in which the Si—C bond containing film 416 is to be formed and exposes the other regions on the Si—C bond containing film 416a. Subsequently, the Si—C bond containing film 416 is formed by dry etching of the Si—C bond containing film 416a with the resist pattern 26 being used as a mask. In the dry etching, a gas which contains oxygen is used, for example.

Figure 10C:
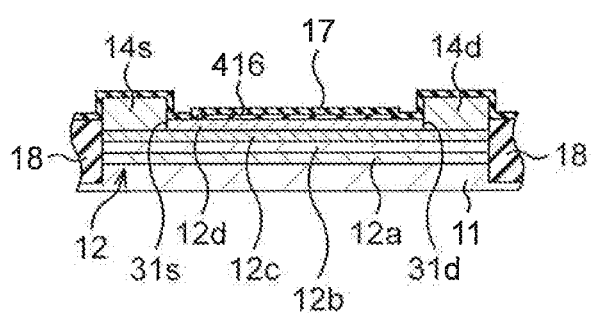

Then, as depicted in FIG. 10C, the resist pattern 26 is removed. Thereafter, the passivation film 17 is formed which covers the Si—C bond containing film 416, the surface layer 12d, the source electrode 14s, the drain electrode 14d, and the element isolation region 18.

Figure 10D:
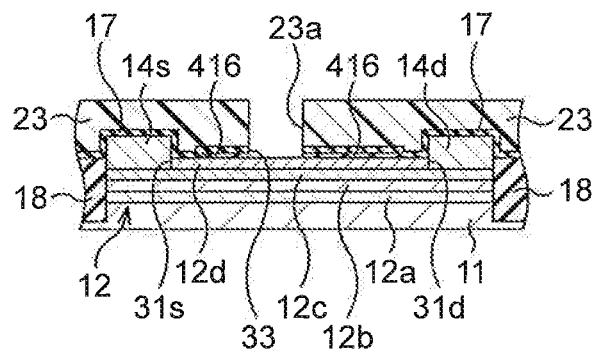

Subsequently, as depicted in FIG. 10D, the resist pattern 23 is formed which has an opening 23a in a region in which an opening for a gate electrode is to be formed on the passivation film 17. Then, the opening 33 is formed in the passivation film 17 and the Si—C bond containing film 416 by dry etching which uses the resist pattern 23 as a mask. After formation of the opening 33, the resist pattern 23 is removed.

Figure 10E:
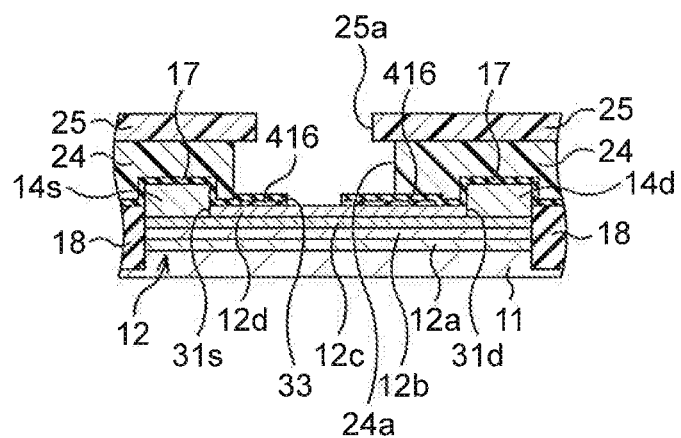

Then, as depicted in FIG. 10E, the resist pattern 24 which has the opening 24a for the gate electrode and the resist pattern 25 which has the opening 25a narrower than the opening 24a are formed on the passivation film 17.

Figure 10F:
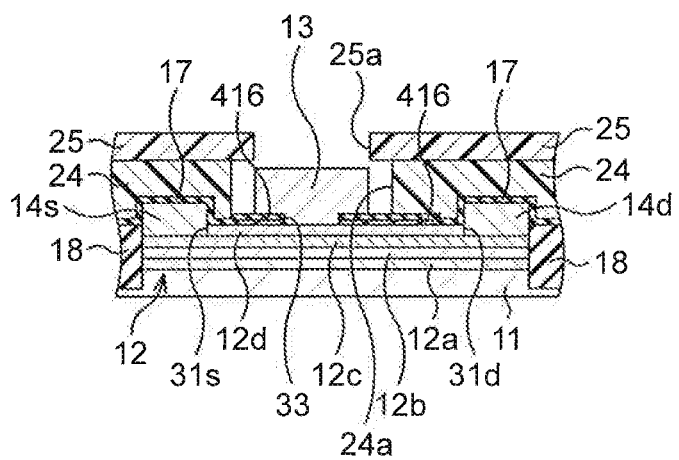

Thereafter, as depicted in FIG. 10F, the gate electrode 13 which contacts the surface layer 12d through the opening 33 is formed on the passivation film 17.

Figure 10G:
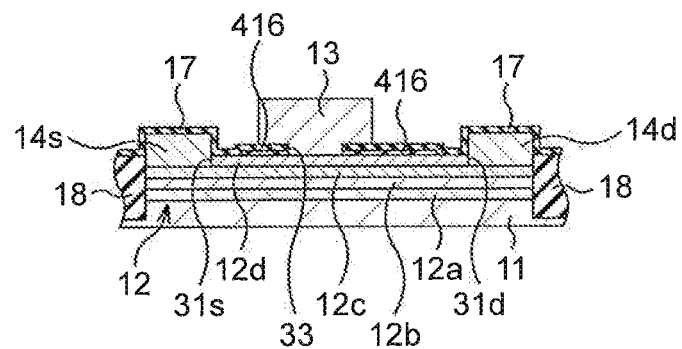

Subsequently, as depicted in FIG. 10G, the resist patterns 24 and 25 are removed together with an Ni layer and an Au layer thereon with a warmed organic solvent.

Figure 10H:
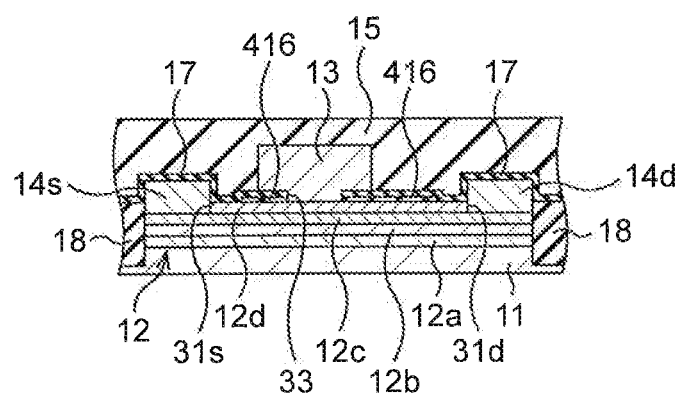

Then, as depicted in FIG. 10H, the insulating film 15 which covers the gate electrode 13 is formed on the passivation film 17.

Figure 10I:
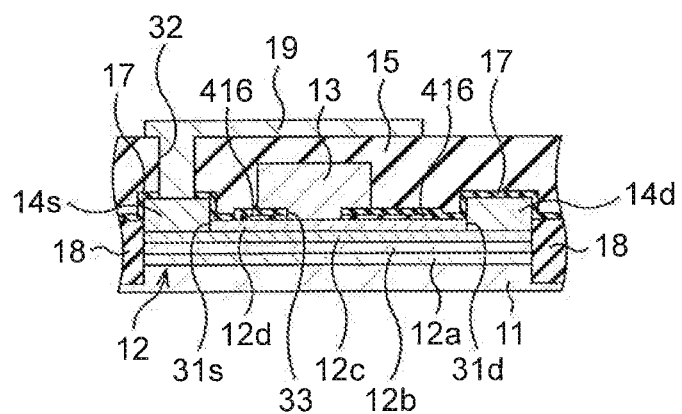

Thereafter, as depicted in FIG. 10I, the opening 32 which exposes a part of the source electrode 14s is formed in the insulating film 15 and the passivation film 17. Subsequently, the field plate 19 connected to the source electrode 14s through the opening 32 is formed on the insulating film 15.

Then, a protective film, a wiring, and so on are formed as necessary, and the GaN-based HEMT (semiconductor device) is completed.

In the GaN-based HEMT manufactured by the method, since the Si—C bond containing film 416 is formed with a chemical synthesis SOG agent, there exists a bond in which O (oxygen) is between Ga (gallium) contained in the surface layer 12d and Si (silicon) contained in the Si—C bond containing film 416, similarly to in the first embodiment. In other words, a bond represented by "Ga—O—Si" exists. Due to generation of the bond, a dangling bond in the vicinity of an upper surface of the surface layer 12d disappears effectively. Therefore, a current collapse and a leakage current are suppressed effectively.

Fifth Embodiment

Figure 11:
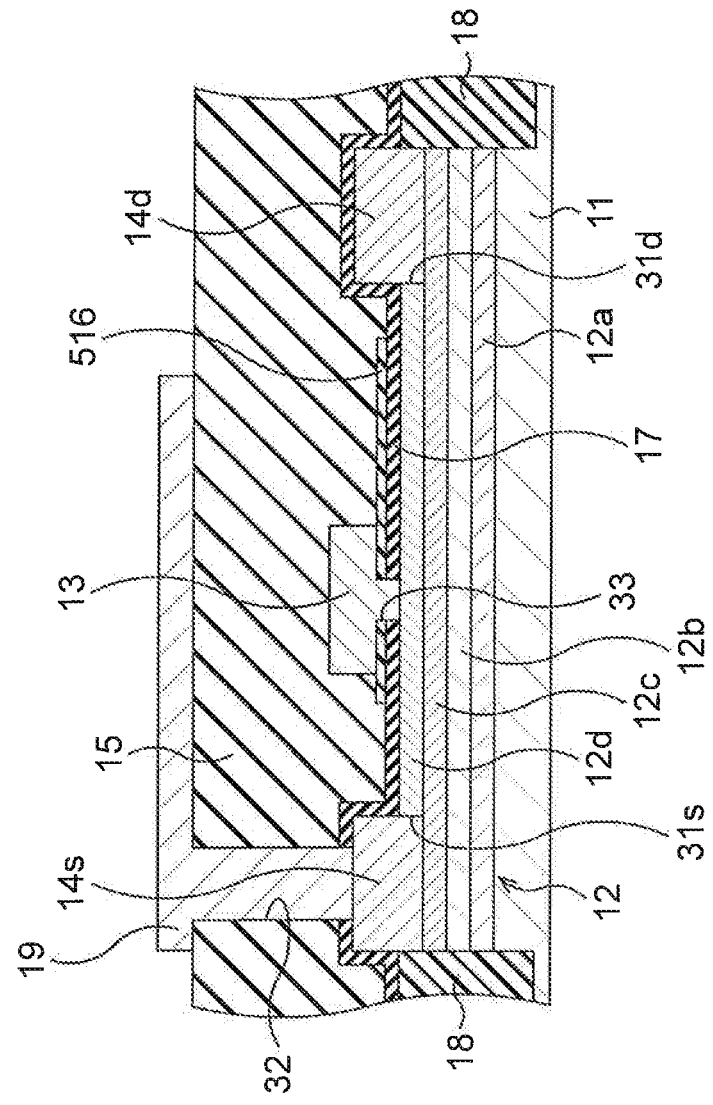
FIG. 11 is a cross-sectional view depicting a structure of a compound semiconductor device according to a fifth embodiment.

Next, a fifth embodiment will be described. FIG. 11 is a cross-sectional view which depicts a structure of a GaN-based HEMT (compound semiconductor device) according to the fifth embodiment.

In the fifth embodiment, as depicted in FIG. 11, the Si—C bond containing film 116 is not formed and an Si—C bond containing film 516 is formed on a part of an upper surface of the passivation film 17. The Si—C bond containing film 516, on the drain electrode 14d side of the opening 33, exists from the opening 33 to a position between an end portion on the drain electrode 14d side of the field plate 19 and the drain electrode 14d in planar view. The Si—C bond containing film 516, on the source electrode 14s side of the opening 33, exists from the opening 33 to a position between an end portion in the source electrode 14s side of the gate electrode 13 and the source electrode 14s in planar view. Other configuration is similar to that of the first embodiment.

In the GaN-based HEMT configured as above, since the Si—C bond containing film 516 is formed on the part of the upper surface of the passivation film 17, traps due to dangling bonds in the vicinity of the upper surface of the passivation film 17 in particular are substantially decreased. Compared with the second embodiment, a current collapse is suppressed sufficiently similarly to in the fourth embodiment, though an effect to decrease the traps is lower. Further, since the Si—C bond containing film 516 is electrically insulated from the drain electrode 14d, it is possible to secure a higher breakdown voltage compared with the second embodiment. In a case where the Si—C bond containing film 516 is electrically insulated from the gate electrode 13 or from both of the drain electrode 14d and the gate electrode 13 also, a high withstand voltage can be secured.

Next, a method of manufacturing the GaN-based HEMT according to the fifth embodiment will be described. FIG. 12A to FIG. 12D are cross-sectional views which depict the method of manufacturing the GaN-based HEMT according to the fifth embodiment in a sequence of process steps.

Figure 12A:
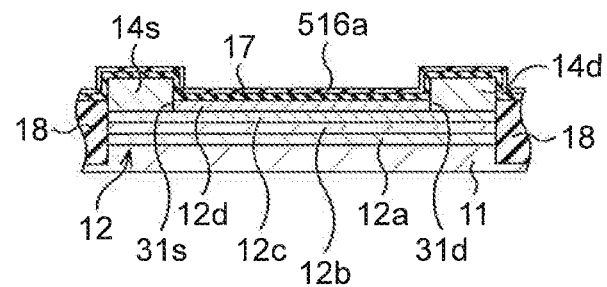
FIG. 12A to FIG. 12D are cross-sectional views depicting a method of manufacturing the GaN-based HEMT according to the fifth embodiment in a sequence of process steps.

First, the treatments to formation of the passivation film 17 are performed similarly to in the second embodiment (FIG. 7A). Then, as depicted in FIG. 12A, an Si—C bond containing film 516a is formed on the passivation film 17. In formation of the Si—C bond containing film 516a, application and curing of a chemical synthesis SOG agent is performed similarly to in the formation of the Si—C bond containing film 116 in the first embodiment, for example.

Figure 12B:
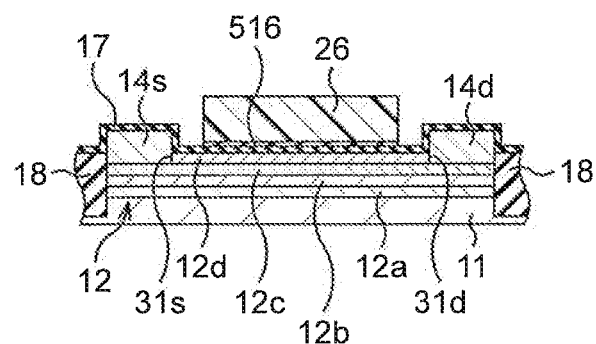

Thereafter, as depicted in FIG. 12B, the resist pattern 26 is formed which covers a region in which the Si—C bond containing film 516 is to be formed and exposes the other regions on the Si—C bond containing film 516a. Subsequently, the Si—C bond containing film 516 is formed by dry etching of the Si—C bond containing film 516 with the resist pattern 26 being used as a mask. In the dry etching, a mixed etching gas of oxygen and $SF_6$ is used, for example.

Figure 12C:
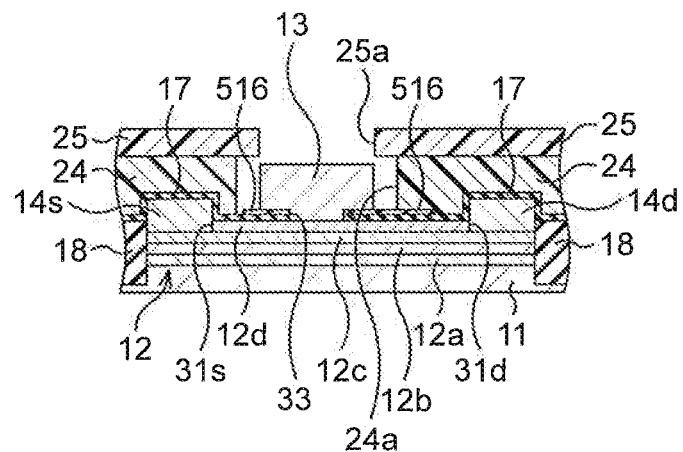

Subsequently, as depicted in FIG. 12C, the resist pattern 26 is removed. Then, the resist pattern 24, the resist pattern 25, and the gate electrode 13 are formed similarly to in the first embodiment, the opening 33.

Figure 12D:
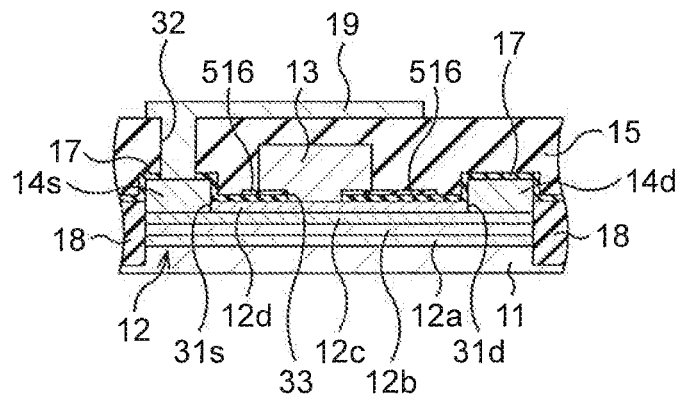

Thereafter, as depicted in FIG. 12D, the resist patterns 24 and 25 are removed. Subsequently, the insulating film 15, the opening 32, and the field plate 19 are formed similarly to in the fourth embodiment.

Then, a protective film, a wiring, and so on are formed as necessary, and the GaN-based HEMT (semiconductor device) is completed.

In the GaN-based HEMT manufactured by the method, since the Si—C bond containing film 516 is formed with a chemical synthesis SOG agent, there exists a bond in which O (oxygen) is between Si (silicon) contained in the passivation film 17 and Si (silicon) contained in the Si—C bond containing film 516, similarly to in the second embodiment. In other words, a bond represented by "Si—O—Si" exists. Due to generation of the bond, a dangling bond in the vicinity of an upper surface of the passivation film 17 disappears effectively. Therefore, a current collapse and a leakage current are suppressed effectively.

Sixth Embodiment

Figure 13:
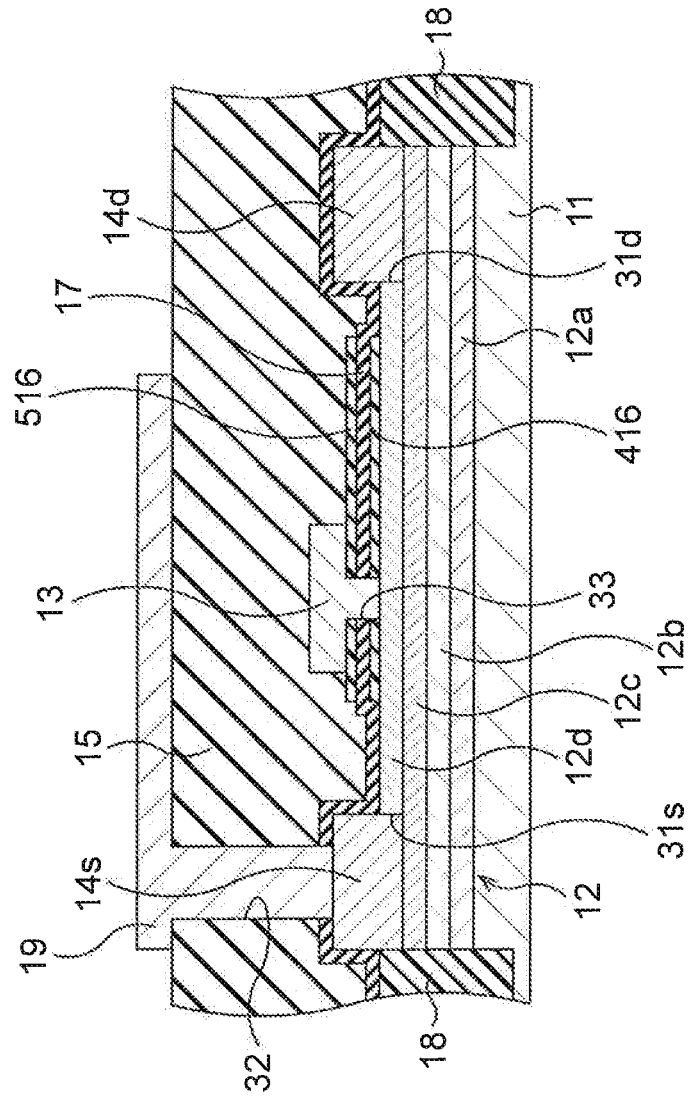
FIG. 13 is a cross-sectional view depicting a structure of a compound semiconductor device according to a sixth embodiment.

Next, a sixth embodiment will be described. FIG. 13 is a cross-sectional view which depicts a structure of a GaN-based HEMT (compound semiconductor device) according to the sixth embodiment.

In the sixth embodiment, as depicted in FIG. 13, the Si—C bond containing film 516 is formed on a part of an upper surface of the passivation film 17. Other configuration is similar to that of the fourth embodiment. In other words, the fourth embodiment and the fifth embodiment are combined in the sixth embodiment.

In the GaN-based HEMT configured as above, a current collapse and a leakage current are further suppressed compared with the fourth embodiment and the fifth embodiment.

In order to manufacture the compound semiconductor device according to the sixth embodiment, the method of manufacturing the fourth embodiment and the method of manufacturing the fifth embodiment may be combined.

Seventh Embodiment, Eighth Embodiment, and Ninth Embodiment

Figure 14A:
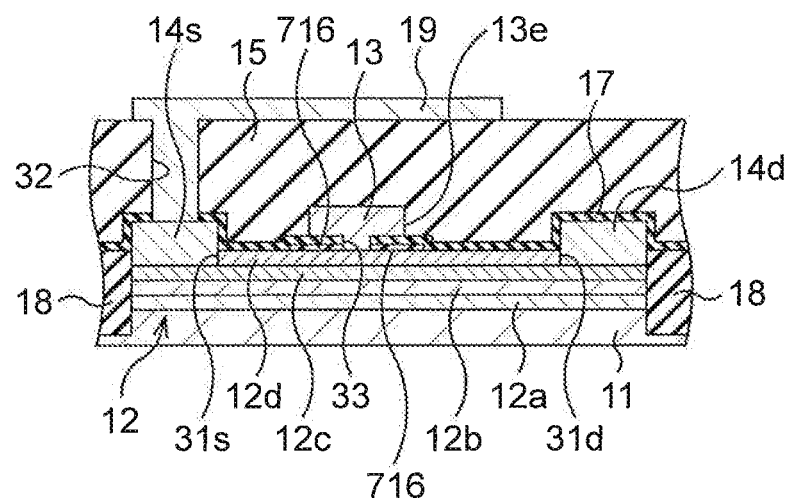
FIG. 14A, FIG. 14B, and FIG. 14C are cross-sectional views depicting structures of compound semiconductor devices according to a seventh embodiment, an eighth embodiment, and a ninth embodiment, respectively.
Figure 14B:
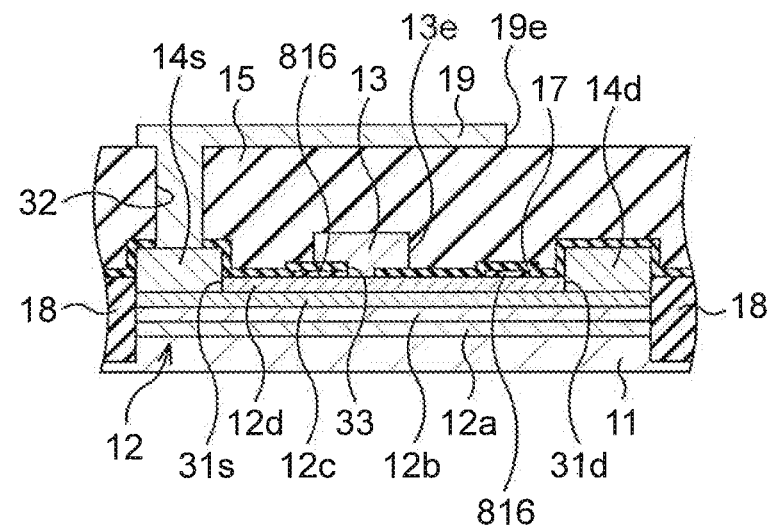
Figure 14C:
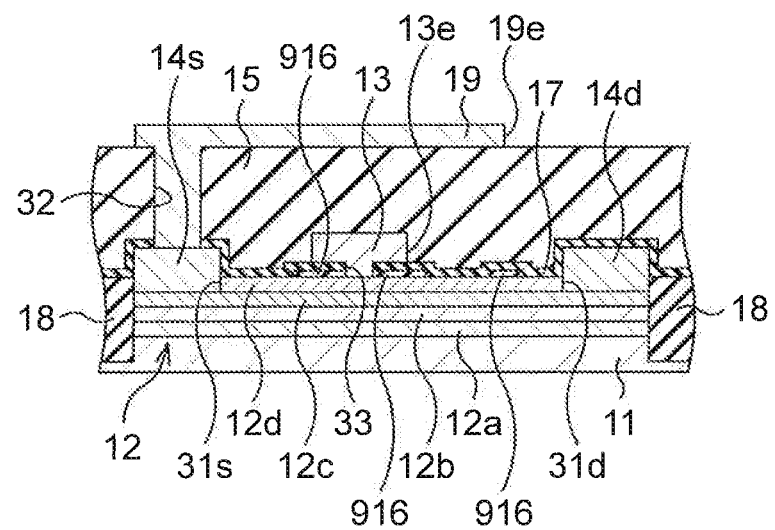

Next, a seventh embodiment, an eighth embodiment, and a ninth embodiment will be described. FIG. 14A, FIG. 14B, and FIG. 14C are cross-sectional views which depict structures of GaN-based HEMTs (compound semiconductor devices) according to the seventh embodiment, the eighth embodiment, and the ninth embodiment, respectively.

In the seventh embodiment, as depicted in FIG. 14A, the Si—C bond containing film 116 is not formed and an Si—C bond containing film 716 is formed on a part of an upper surface of the surface layer 12d. The Si—C bond containing film 716, on the drain electrode 14d side of the opening 33, exists from the opening 33 to a position between an end portion 13e on the drain electrode 14d side of the gate electrode 13 and the drain electrode 14d in planar view. The Si—C bond containing film 716, on the source electrode 14s side of the opening 33, exists from the opening 33 to a position between an end portion on the source electrode 14s side of the gate electrode 13 and the source electrode 14s in planar view. Other configuration is similar to that of the first embodiment.

In the eighth embodiment, as depicted in FIG. 14B, the Si—C bond containing film 116 is not formed and an Si—C bond containing film 816 is formed on a part of an upper surface of the surface layer 12d. The Si—C bond containing film 816, on the drain electrode 14d side of the opening 33, does not exist below the gate electrode 13 and exists from a position between the end portion 13e and an end portion 19e on the drain electrode 14d side of the field plats 19 to a position between the end portion 19e and the drain electrode 14d in planar view. The Si—C bond containing film 816, on the source electrode 14s side of the opening 33, exists from the opening 33 to a position between an end portion on the source electrode 14s side of the gate electrode 13 and the source electrode 14s in planar view. Other configuration is similar to that of the first embodiment.

In the ninth embodiment, as depicted in FIG. 14C, the Si—C bond containing film 116 is not formed and an Si—C bond containing film 916 is formed on a part of an upper surface of the surface layer 12d. The Si—C bond containing film 916, on the drain electrode 14d side of the opening 33, has a part which exists from the opening 33 to a position between the end portion 13e and the end portion 19e, and a part which exists from a position between the end portion 13e and the end portion 19e to a position between the end portion 19e and the drain electrode 14d in planar view. The Si—C bond containing film 916, on the source electrode 14s side of the opening 33, exists from the opening 33 to a position between an end portion in the source electrode 14s side of the gate electrode 13 and the source electrode 14s. Other configuration is similar to that of the first embodiment.

According to the seventh embodiment, the eighth embodiment, and the ninth embodiment also, an effect to suppress a current collapse and a leakage current and an effect to secure a high breakdown voltage can be obtained.

As described above, the regions to which the particularly high electric field is applied are below the end portion on the drain electrode 14d side of the gate electrode 13 and below the end portion on the drain electrode side 14d of the field plate 19. Thus, in any embodiment, the Si—C bond containing film on the source electrode 14s side of the opening 33 may be omitted. Further, in order to eliminate a trap in the region to which the particularly high electric field is applied, it is preferable that the Si—C bond containing film is provided with a part which has a width of about 0.5 µm in both directions from the end portion on the drain electrode 14d side of the gate electrode 13, to the gate electrode 13 side and to the drain electrode 14d side, respectively. Similarly, it is preferable that the Si—C bond containing film is provided with a part which has a width of about 0.5 µm in both directions from the end portion on the drain electrode 14d side of the field plate 19, to the gate electrode side and to the drain electrode 14d side, respectively.

Tenth to Eighteenth Embodiments

Figure 15A:
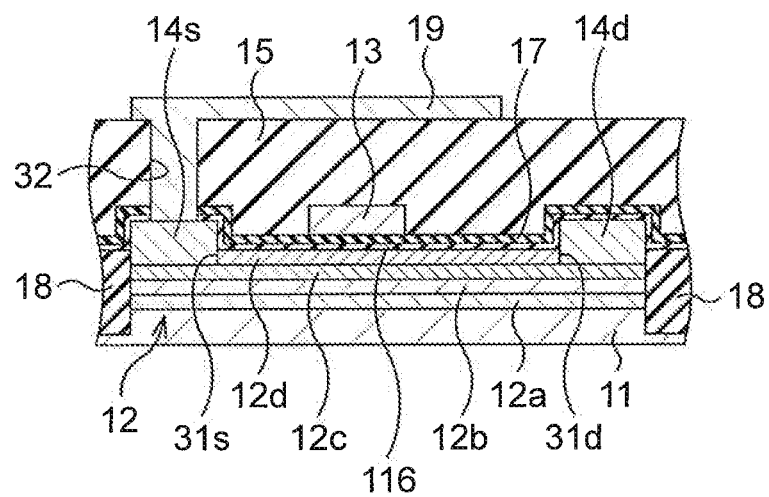
FIG. 15A, FIG. 15B, and FIG. 15C are cross-sectional views depicting structures of compound semiconductor devices according to a tenth embodiment, an eleventh embodiment, and a twelfth embodiment, respectively.
Figure 15B:
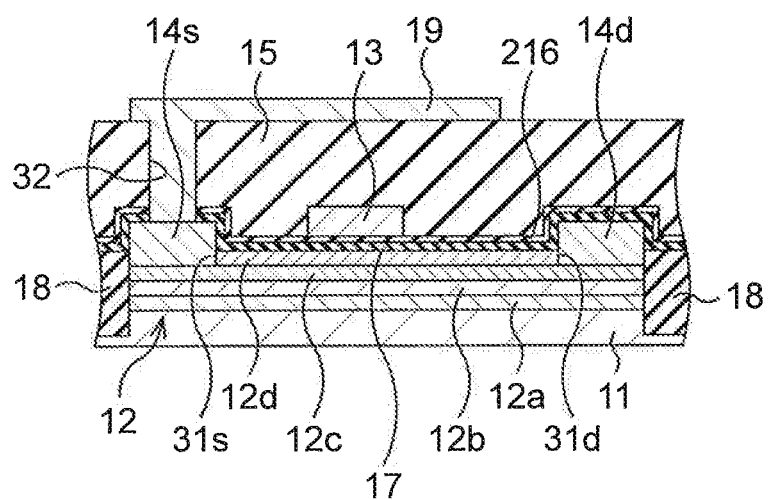
Figure 15C:
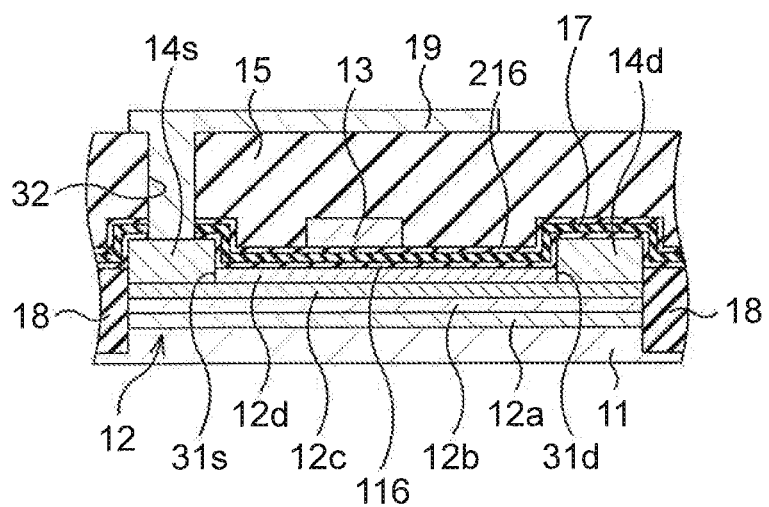
Figure 16A:
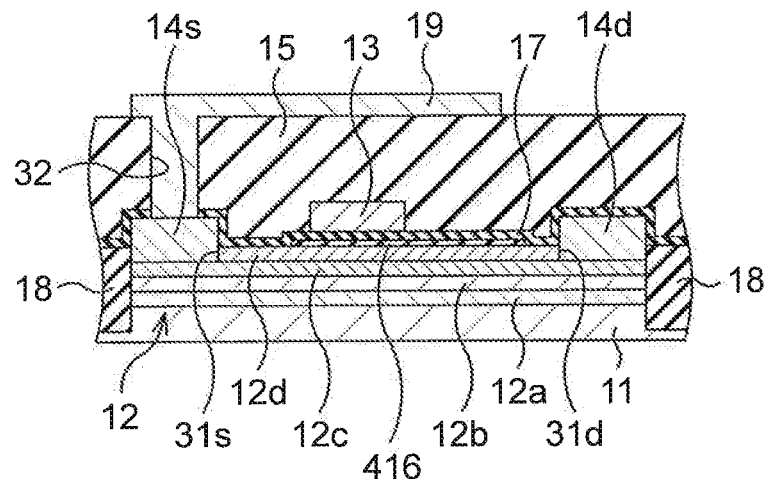
FIG. 16A, FIG. 16B, and FIG. 16C are cross-sectional views depicting structures of compound semiconductor devices according to a thirteenth embodiment, a fourteenth embodiment, and a fifteenth embodiment, respectively.
Figure 16B:
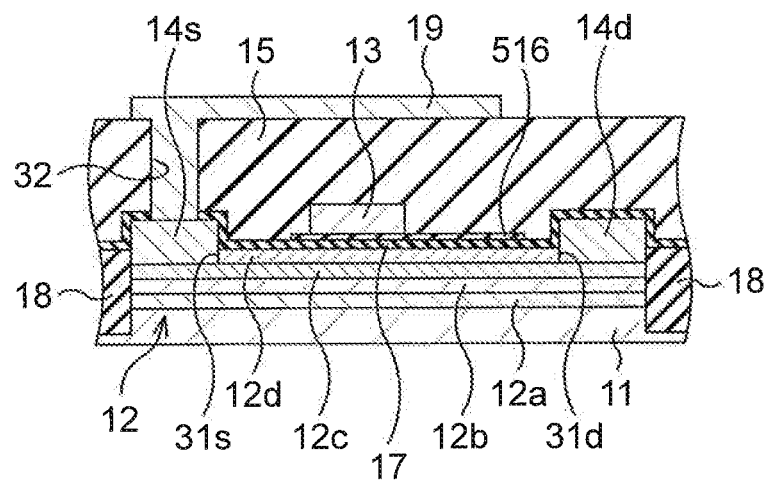
Figure 16C:
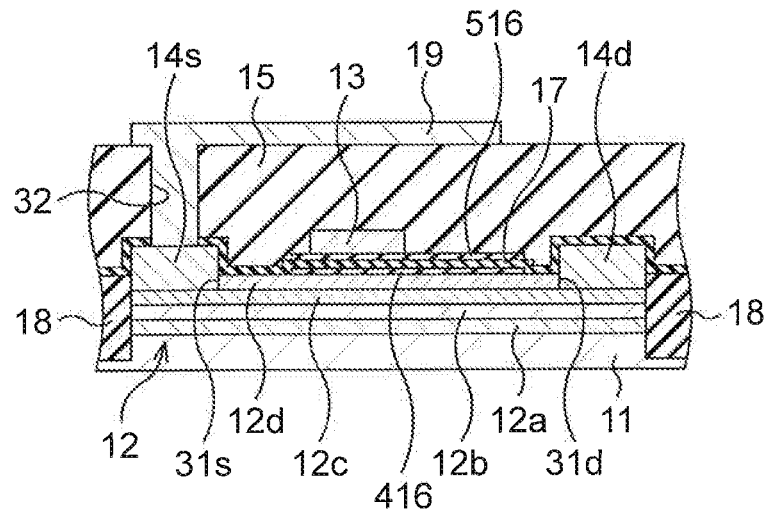
Figure 17A:
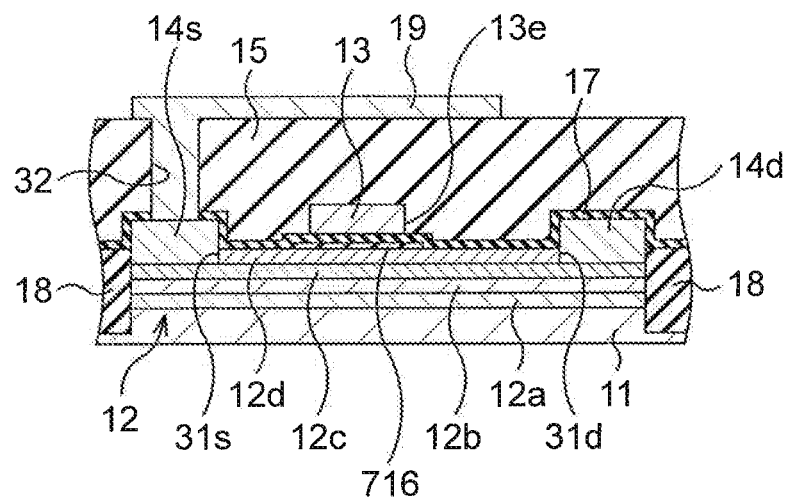
FIG. 17A, FIG. 17B, and FIG. 17C are cross-sectional views depicting structures of compound semiconductor devices according to a sixteenth embodiment, a seventeenth embodiment, and an eighteenth embodiment, respectively.
Figure 17B:
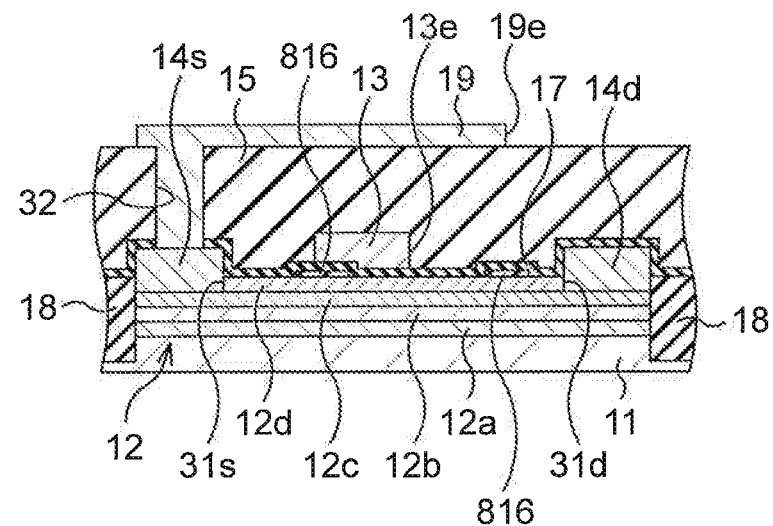
Figure 17C:
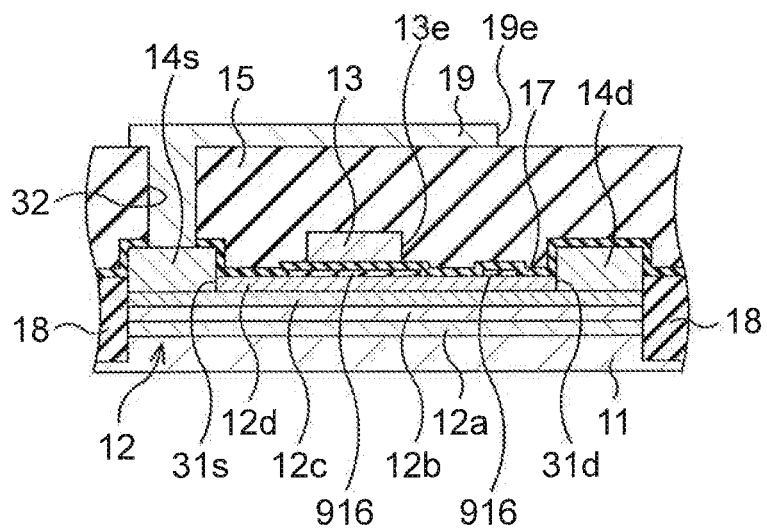

Next, tenth to eighteenth embodiments will be described. FIG. 15A, FIG. 15B, and FIG. 15C are cross-sectional views which depict structures of GaN-based HEMTs (compound semiconductor devices) according to the tenth embodiment, the eleventh embodiment, and the twelfth embodiment, respectively. FIG. 16A, FIG. 16B, and FIG. 16C are cross-sectional views which depict structures of GaN-based HEMTs (compound semiconductor devices) according to the thirteenth embodiment, the fourteenth embodiment, and the fifteenth embodiment, respectively. FIG. 17A, FIG. 17B, and FIG. 17C are cross-sectional views which depict structures of GaN-based HEMTs (compound semiconductor devices) according to the sixteenth embodiment, the seventeenth embodiment, and the eighteenth embodiment, respectively.

In contrast to the first embodiment, in which the gate electrode 13 forms Schottky-junction with the compound semiconductor stacked structure 12 through the opening 33, in the tenth embodiment, the Si—C bond containing film 116 and the passivation film 17 are between the gate electrode 13 and the compound semiconductor stacked structure 12, and the passivation film 17 functions as a gate insulating film. In other words, the opening 33 is not formed and an MIS type structure is adopted. Other configuration is similar to that of the first embodiment.

According to the tenth embodiment as above also, a current collapse and a leakage current are suppressed effectively similarly to in the first embodiment.

Though a material of the passivation film 17 is not limited in particular, and an oxide, a nitride, or an oxynitride of Si, Al, Hf, Zr, Ti, Ta, or W, for example, is preferable, and an Al oxide is particularly preferable. SiN, $SiO_2$, HfO, $Al_2O_3$, AlN, or the like may be used.

The eleventh to eighteenth embodiments are embodiments in which the MIS type structure is each applied to the second to the ninth embodiments. In order to obtain the passivation film 17 included in the MIS type structure, formation of the opening 33 may be simply omitted, for example.

Nineteenth Embodiment

Figure 18:
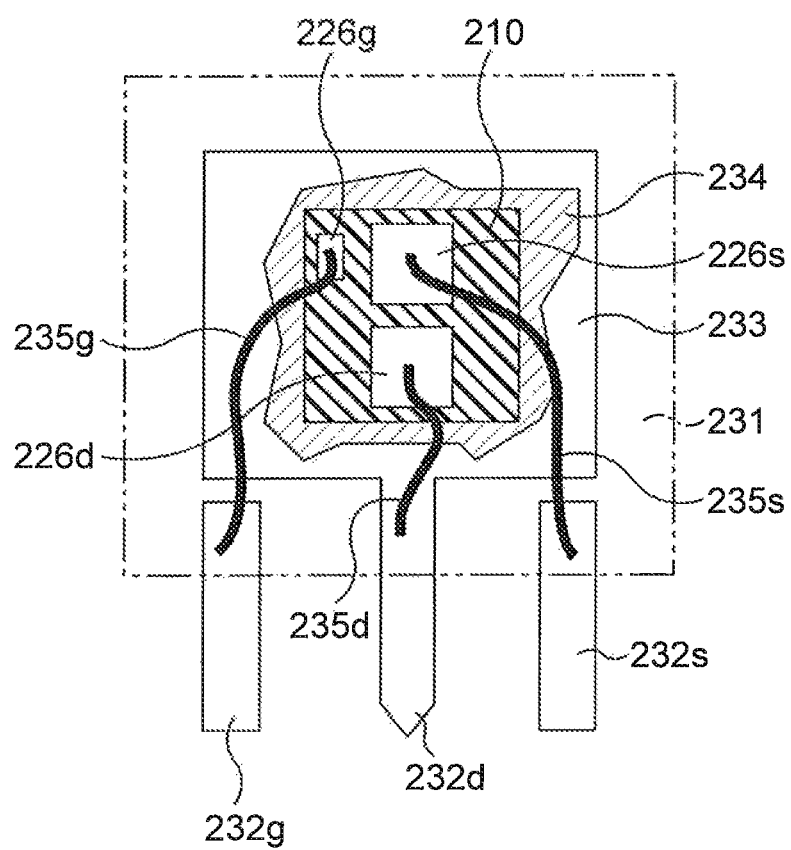
FIG. 18 is a drawing depicting a discrete package according to a nineteenth embodiment.

A nineteenth embodiment relates to a discrete package of a compound semiconductor device which includes a GaN-based HEMT. FIG. 18 is a drawing depicting the discrete package according to the nineteenth embodiment.

In the nineteenth embodiment, as depicted in FIG. 18, a back surface of a HEMT chip 210 of the compound semiconductor device according to any one of the first to eighteenth embodiments is fixed on a land (die pad) 233, using a die attaching agent 234 such as solder. One end of a wire 235d such as an Al wire is bonded to a drain pad 226d, to which the drain electrode 14d is connected, and the other end of the wire 235d is bonded to a drain lead 232d integral with the land 233. One end of a wire 235s such as an Al wire is bonded to a source pad 226s, to which the source electrode 14s is connected, and the other end of the wire 235s is bonded to a source lead 232s separated from the land 233. One end of a wire 235g such as an Al wire is bonded to a gate pad 226g, to which the gate electrode 13 is connected, and the other end of the wire 235g is bonded to a gate lead 232g separated from the land 233. The land 233, the HEMT chip 210 and so forth are packaged with a molding resin 231, so as to project outwards a portion of the gate lead 232g, a portion of the drain lead 232d, and a portion of the source lead 232s.

The discrete package may be manufactured by the procedures below, for example. First, the HEMT chip 210 is bonded to the land 233 of a lead frame, using a die attaching agent 234 such as solder. Next, with the wires 235g, 235d, and 235s, the gate pad 226g is connected to the gate lead 232g of the lead frame, the drain pad 226d is connected to the drain lead 232d of the lead frame, and the source pad 226s is connected to the source lead 232s of the lead frame, respectively, by wire bonding. The molding with the molding resin 231 is conducted by a transfer molding process. The lead frame is then cut away.

Twentieth Embodiment

Figure 19:
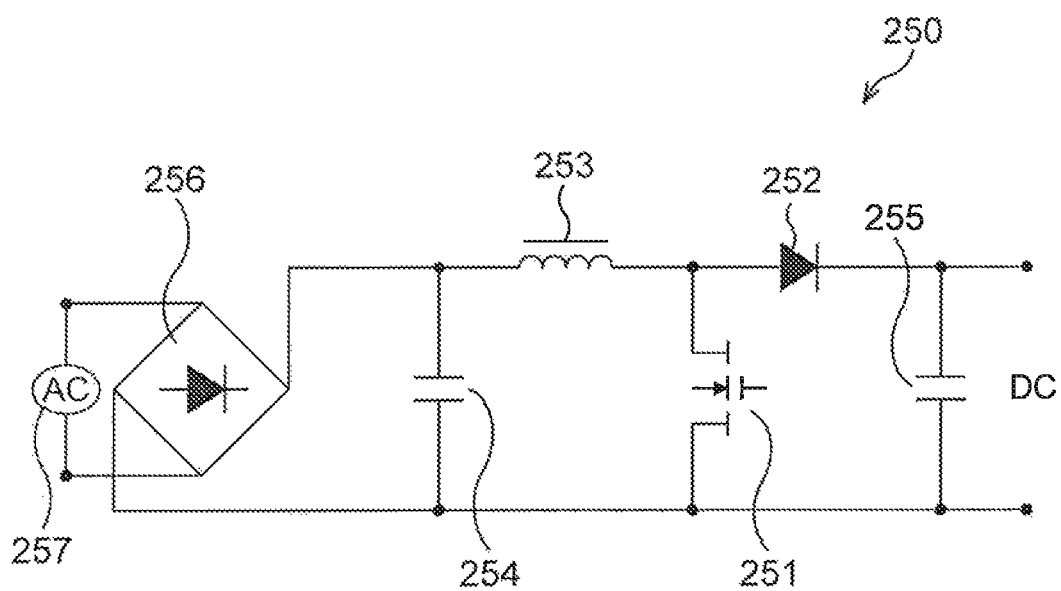
FIG. 19 is a wiring diagram depicting a PFC circuit according to a twentieth embodiment.

Next, a twentieth embodiment will be explained. The twentieth embodiment relates to a PFC (power factor correction) circuit equipped with a compound semiconductor device which includes a GaN-based HEMT. FIG. 19 is a wiring diagram depicting the PFC circuit according to the twentieth embodiment.

The PFC circuit 250 has a switching element (transistor) 251, a diode 252, a choke coil 253, capacitors 254 and 255, a diode bridge 256, and an AC power source (AC) 257. The drain electrode of the switching element 251, the anode terminal of the diode 252, and one terminal of the choke coil 253 are connected with each other. The source electrode of the switching element 251, one terminal of the capacitor 254, and one terminal of the capacitor 255 are connected with each other. The other terminal of the capacitor 254 and the other terminal of the choke coil 253 are connected with each other. The other terminal of the capacitor 255 and the cathode terminal of the diode 252 are connected with each other. A gate driver is connected to the gate electrode of the switching element 251. The AC 257 is connected between both terminals of the capacitor 254 via the diode bridge 256. A DC power source (DC) is connected between both terminals of the capacitor 255. In the embodiment, the compound semiconductor device according to any one of the first to eighteenth embodiments is used as the switching element 251.

In the method of manufacturing the PFC circuit 250, for example, the switching element 251 is connected to the diode 252, the choke coil 253 and so forth with solder, for example.

Twenty-First Embodiment

Figure 20:
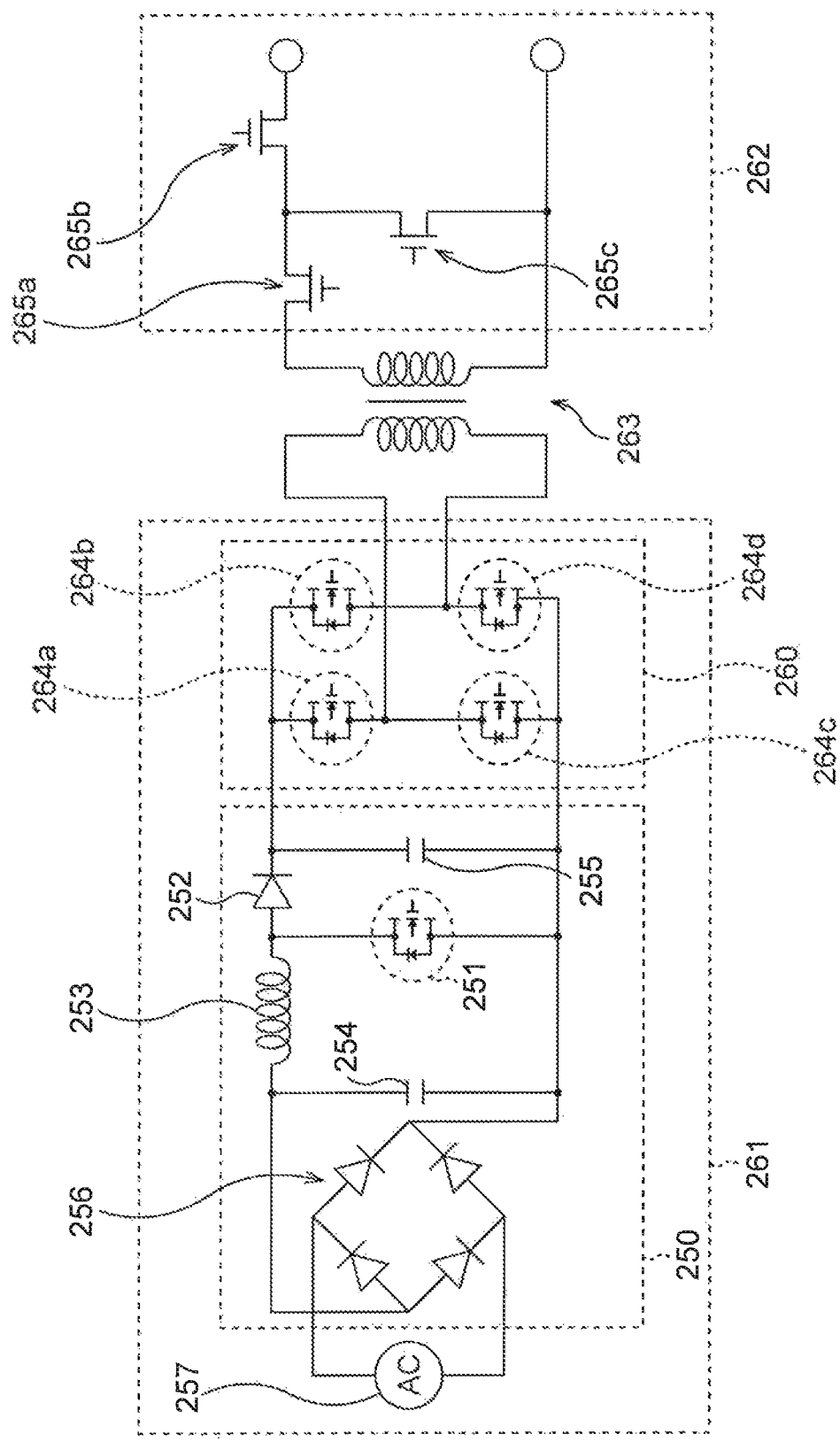
FIG. 20 is a wiring diagram depicting a power supply apparatus according to a twenty-first embodiment.

Next, a twenty-first embodiment will be explained. The twenty-first embodiment relates to a power supply apparatus equipped with a compound semiconductor device which includes a GaN-based HEMT. FIG. 20 is a wiring diagram depicting the power supply apparatus according to the twenty-first embodiment.

The power supply apparatus includes a high-voltage, primary-side circuit 261, a low-voltage, secondary-side circuit 262, and a transformer 263 arranged between the primary-side circuit 261 and the secondary-side circuit 262.

The primary-side circuit 261 includes the PFC circuit 250 according to the twentieth embodiment, and an inverter circuit, which may be a full-bridge inverter circuit 260, for example, connected between both terminals of the capacitor 255 in the PFC circuit 250. The full-bridge inverter circuit 260 includes a plurality of (four, in the embodiment) switching elements 264a, 264b, 264c and 264d.

The secondary-side circuit 262 includes a plurality of (three, in the embodiment) switching elements 265a, 265b and 265c.

In the embodiment, the compound semiconductor device according to any one of first to eighteenth embodiments is used for the switching element 251 of the PFC circuit 250, and for the switching elements 264a, 264b, 264c and 264d of the full-bridge inverter circuit 260. The PFC circuit 250 and the full-bridge inverter circuit 260 are components of the primary-side circuit 261. On the other hand, a silicon-based general MIS-FET (field effect transistor) is used for the switching elements 265a, 265b and 265c of the secondary-side circuit 262.

Twenty-Second Embodiment

Figure 21:
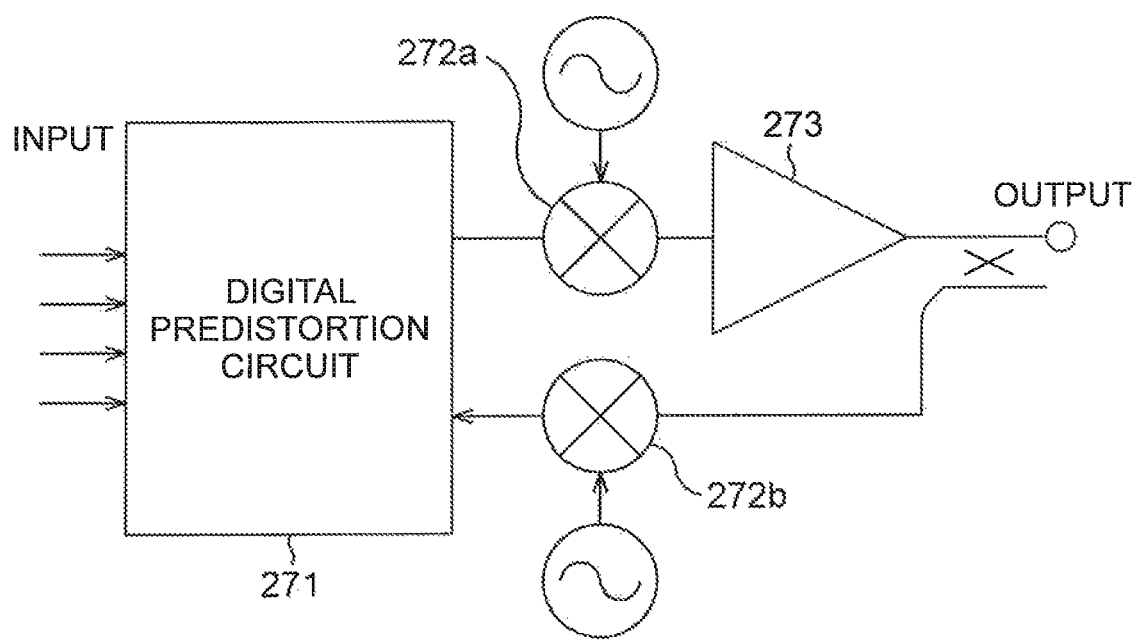
FIG. 21 is a wiring diagram depicting an amplifier according to a twenty-second embodiment.

Next, a twenty-second embodiment will be explained. The twenty-second embodiment relates to an amplifier equipped with the compound semiconductor device which includes a GaN-based HEMT. FIG. 21 is a wiring diagram depicting the amplifier according to the twenty-second embodiment.

The amplifier includes a digital predistortion circuit 271, mixers 272a and 272b, and a power amplifier 273.

The digital predistortion circuit 271 compensates non-linear distortion in input signals. The mixer 272a mixes the input signal having the non-linear distortion already compensated, with an AC signal. The power amplifier 273 includes the compound semiconductor device according to any one of the first to eighteenth embodiments, and amplifies the input signal mixed with the AC signal. In the embodiment, the signal on the output side may be mixed, upon switching, with an AC signal by the mixer 272b, and may be sent back to the digital predistortion circuit 271. The amplifier may be used as a high-frequency amplifier or a high-output amplifier.

A composition of the compound semiconductor layer used in the compound semiconductor stacked structure is not particularly limited, and a nitride such as GaN, AlN, and InN, for example, may be used. Further, a mixed crystal thereof may be used.

Structures of the gate electrode, the source electrode, and the drain electrode are not limited to those of the aforementioned embodiments. For example, each of the electrodes may be configured with a single layer. A method of forming the electrodes is not limited to a lift-off method. The heat treatment after the formation of the source electrode and the drain electrode may be omitted if an ohmic characteristic may be obtained. Further, the gate electrode may be subjected to a heat treatment.

As the substrate, an SIC substrate, a sapphire substrate, a silicon substrate, a GaN substrate, a GaAs substrate, or the like may be used. The substrate may be any one of a conductive substrate, a semi-insulating substrate, and an insulating substrate. The thickness, the material, and so on of each layer are not limited to those in the above-described embodiment.

According to the above-described compound semiconductor device and so on, since the Si—C bond containing film is formed, a current collapse can be suppressed further more.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one of more embodiments of the present invention have been described in detail, it should be understood that the various changes, substitutions, and alterations could be made hereto without departing from the spirit and scope of the invention.

What is claimed is:

1. A compound semiconductor device, comprising:
    a substrate;
    a compound semiconductor stacked structure of nitride over the substrate;
    a passivation film that covers the compound semiconductor stacked structure;
    a gate electrode, a source electrode, and a drain electrode at a level above the compound semiconductor stacked structure; and
    an Si—C bond containing film that contains an Si—C bond and includes a part between the source electrode and the drain electrode, the part contacting at least a part of an upper surface of the compound semiconductor stacked structure or at least a part of an upper surface of the passivation film, wherein the Si—C bond containing film contains a methyl group.

2. The compound semiconductor device according to claim 1, wherein the Si—C bond containing film includes a part between an end portion on the drain electrode side of the gate electrode and the compound semiconductor stacked structure in a thickness direction.

3. The compound semiconductor device according to claim 1, wherein
    the compound semiconductor stacked structure contains gallium atoms, and
    the gallium atoms in the compound semiconductor stacked structure are bonded with silicon atoms in the Si—C bond containing film via oxygen atoms.

4. The compound semiconductor device according to claim 1, wherein
    the passivation film contains silicon atoms, and
    the silicon atoms in the passivation film are bonded with silicon atoms in the Si—C bond containing film via oxygen atoms.

5. The compound semiconductor device according to claim 1, wherein the Si—C bond containing film is electrically insulated from the gate electrode or the drain electrode or both of them.

6. The compound semiconductor device according to claim 1, comprising a field plate that is connected to the source electrode and extends to between the gate electrode and the drain electrode,
    wherein the Si—C bond containing film includes a part between an end portion on the drain electrode side of the filed plate and the compound semiconductor stacked structure in a thickness direction.

7. The compound semiconductor device according to claim 1, wherein the Si—C bond containing film contains a hydroxyl group.

8. A power supply apparatus, comprising
    a compound semiconductor device, wherein the compound semiconductor device comprises:
    a substrate;
    a compound semiconductor stacked structure of nitride over the substrate;
    a passivation film that covers the compound semiconductor stacked structure;
    a gate electrode, a source electrode, and a drain electrode at a level above the compound semiconductor stacked structure; and
    an Si—C bond containing film that contains an Si—C bond and includes a part between the source electrode and the drain electrode, the part contacting at least a part of an upper surface of the compound semiconductor stacked structure or at least a part of an upper surface of the passivation film, wherein the Si—C bond containing film contains a methyl group.

9. An amplifier, comprising
    a compound semiconductor device, wherein the compound semiconductor device comprises:
    a substrate;
    a compound semiconductor stacked structure of nitride over the substrate;
    a passivation film that covers the compound semiconductor stacked structure;
    a gate electrode, a source electrode, and a drain electrode at a level above the compound semiconductor stacked structure; and
    an Si—C bond containing film that contains an Si—C bond and includes a part between the source electrode and the drain electrode, the part contacting at least a part of an upper surface of the compound semiconductor stacked structure or at least a part of an upper surface of the passivation film, wherein the Si—C bond containing film contains a methyl group.

10. A method of manufacturing a compound semiconductor device, the method comprising:
    forming a compound semiconductor stacked structure of nitride over a substrate;
    forming a passivation film that covers the compound semiconductor stacked structure;
    forming a gate electrode, a source electrode, and a drain electrode at a level above the compound semiconductor stacked structure; and forming an Si—C bond containing film that contains an Si—C bond and includes a part between the source electrode and the drain electrode, the part contacting at least a part of an upper surface of the compound semiconductor stacked structure or at least a part of an upper surface of the passivation film, wherein the forming the Si—C bond containing film comprises:
applying a chemical synthesis spin-on-glass agent; and
curing the chemical synthesis spin-on-glass agent.

11. The method according to claim 10, wherein the Si—C bond containing film includes a part between an end portion on the drain electrode side of the gate electrode and the compound semiconductor stacked structure in a thickness direction.

12. The method according to claim 10, comprising forming a field plate that is connected to the source electrode and extends to between the gate electrode and the drain electrode,
wherein the Si—C bond containing film includes a part between an end portion on the drain electrode side of the field plate and the compound semiconductor stacked structure in a thickness direction.

13. The method according to claim 10, wherein
the compound semiconductor stacked structure contains gallium atoms, and
the gallium atoms in the compound semiconductor stacked structure are bonded with silicon atoms in the Si—C bond containing film via oxygen atoms.

14. The method according to claim 10, wherein
the passivation film contains silicon atoms, and
the silicon atoms in the passivation film are bonded with silicon atoms in the Si—C bond containing film via oxygen atoms.

15. The method according to claim 10, wherein the Si—C bond containing film is electrically insulated from the gate electrode or the drain electrode or both of them.

* * * * *